(12) United States Patent
Elsherbini et al.

(10) Patent No.: US 12,713,536 B2
(45) Date of Patent: Aug. 18, 2026

(54) CONFORMAL POWER DELIVERY STRUCTURES INCLUDING EMBEDDED PASSIVE DEVICES

(71) Applicant: Intel Corporation, Santa Clara, CA (US)

(72) Inventors: Adel Elsherbini, Chandler, AZ (US); Aleksandar Aleksov, Chandler, AZ (US); Feras Eid, Chandler, AZ (US); Henning Braunisch, Phoenix, AZ (US); Thomas L. Sounart, Chandler, AZ (US); Johanna Swan, Scottsdale, AZ (US); Beomseok Choi, Chandler, AZ (US); Krishna Bharath, Phoenix, AZ (US); William J. Lambert, Tempe, AZ (US); Kaladhar Radhakrishnan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 362 days.

(21) Appl. No.: 17/485,250

(22) Filed: Sep. 24, 2021

(65) Prior Publication Data

US 2023/0095608 A1 Mar. 30, 2023

(51) Int. Cl.
*H05K 3/14* (2006.01)
*H05K 3/10* (2006.01)
(Continued)

(52) U.S. Cl.
CPC ............. *H05K 3/146* (2013.01); *H05K 3/102* (2013.01); *H05K 3/303* (2013.01); *H10D 84/01* (2025.01);
(Continued)

(58) Field of Classification Search
CPC ........ H05K 3/146; H05K 3/102; H05K 3/303; H05K 2203/0502; H05K 1/185;
(Continued)

(56) References Cited

U.S. PATENT DOCUMENTS

2006/0223276 A1* 10/2006 Lin ..................... H10W 20/496 438/393
2007/0212845 A1* 9/2007 Lin ..................... H01L 23/5223 257/E21.09
(Continued)

*Primary Examiner* — Duy T Nguyen
(74) *Attorney, Agent, or Firm* — Alliance IP, LLC

(57) ABSTRACT

A embedded passive structure, a microelectronic system, and an integrated circuit device assembly, and a method of forming the embedded passive structure. The embedded passive structure includes a base layer; a passive device attached to the base layer; a first power plane comprising metal and adjacent an upper surface of the base layer, the first power plane having a portion electrically coupled to a terminal of the passive device, wherein an upper surface of a combination of the first power plane and the passive device defines a recess; a second power plane comprising metal, the second power plane at least partially within the recess and having a lower surface that conforms with the upper surface of the combination; and a liner including a dielectric layer between the first power plane and the second power plane.

19 Claims, 11 Drawing Sheets

(51) Int. Cl.
*H05K 3/303* (2026.01)
*H10D 84/01* (2026.01)
*H10W 20/00* (2026.01)

(52) U.S. Cl.
CPC ....... *H10W 20/032* (2026.01); *H10W 20/074* (2026.01); *H05K 2203/0502* (2013.01)

(58) Field of Classification Search
CPC ......... H01L 21/76829; H01L 21/76841; H01L 23/5383; H01L 23/49822; H01L 23/50; H10D 84/01
USPC .......................................................... 257/668
See application file for complete search history.

(56) References Cited

U.S. PATENT DOCUMENTS

| | | | | |
|---|---|---|---|---|
| 2010/0308451 | A1* | 12/2010 | Kodani | H05K 1/09<br>257/E23.068 |
| 2011/0241167 | A1* | 10/2011 | Feustel | H01L 23/5223<br>257/532 |
| 2015/0136449 | A1* | 5/2015 | Yamashita | H05K 3/4602<br>174/251 |
| 2017/0194418 | A1* | 7/2017 | Papavasiliou | H10D 1/692 |
| 2020/0135845 | A1* | 4/2020 | Seidel | H01L 21/7681 |

* cited by examiner 700
770
102
751
Die
752
Die
Package
106
100
754

650
Die
106
Package
652
102
600
100

841
842
VCC
VSS
M1
M2
M3
M4

843
844
M1
M2
M3
M4

852
Active Region
842
Active Region
851
Top Die
M4
M3
M2
M1
Bottom Die
104a
106
108
841
104b
109
800

CONFORMAL POWER DELIVERY STRUCTURES INCLUDING EMBEDDED PASSIVE DEVICES

BACKGROUND

In integrated circuit devices including microelectronic assemblies, passive devices such as capacitors, inductors, transformers, integrated passive devices (IPDs), etc., are placed either on the backside of the package substrate (e.g., landside capacitors), or at the top side of the package substrate (e.g., die side capacitors). Passive devices are generally not embedded in the buildup layers of the package substrate due to their necessary z height and space impact of soldering, the technology used to attach them to the package substrate. In particular, because passive devices have the disadvantage of typically being placed at the bottom of the package substrate and hence needing to be electrically accessed through the core, inductive parasitics and resistive losses may arise. In addition, landside passive devices such as capacitors take away a significant area from ball grid array (BGA) or land grid array (LGA) area. This may lead to the growth of the package to accommodate all necessary BGA or LGA lands. On the other hand, die side passive devices suffer from even larger parasitics and losses to connect them to the power delivery network, since they cannot be placed below the die but must be placed at a certain distance to the side of the die. They can also necessitate package growth as they need space on the top side of the package substrate.

DETAILED DESCRIPTION

Some embodiments propose embedding pre-manufactured passive devices such as capacitors, inductors, transformers, integrated passive devices (IPDs), etc. inside the relatively thick high throughput additive manufacturing (HTAM) conformal power delivery structure. An example of HTAM includes a cold spraying technique, or cold spray.

The embedded passive devices according to embodiments may include, by way of example, thin film capacitors, magnetic core inductors, transformers, thin film resistors, multi-layer ceramic capacitors (MLCCs), integrated passive devices (IPDs) etc. The embedded passive devices may be inside the package (circuit board), inside a molded substrate, on the top side of a die, or on the backside of a die.

A major drawback of the conventional passive embedding process is a reduction in the integrity of the core Cu layer power planes which have large voids inserted in many component embedding process flows. In contrast, an HTAM flow according to some embodiments may actually add additional Cu on the connected power planes resulting in lower voltage drop than the conventional process.

As compared to standard embedding techniques, embodiments advantageously allow embedding the passive devices in a relatively stiff environment which can help, as compared with the state of the art: (1) isolate the passive devices from package stresses; (2) reduce the impact of the passive devices embedding on the mechanical properties of the package as is the case with standard embedded passive devices in package layers; (3) mitigate inductive parasitics and resistive losses; and (4) save space within a package, on either the BGA or LGA side, or on the die side of the package substrate.

Figure 2:
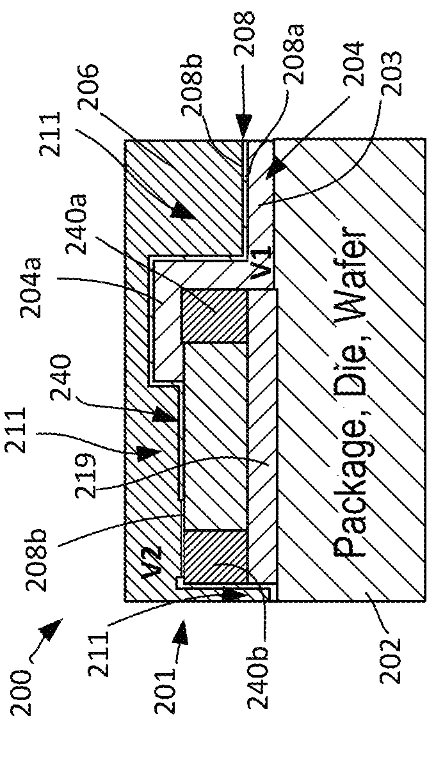
FIG. 2 illustrates an embedded passive structure according to a second embodiment.
Figure 1:
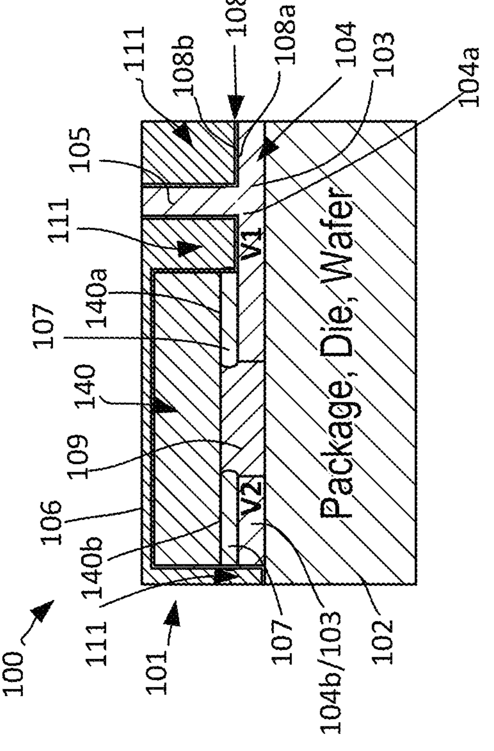
FIG. 1 illustrates an embedded passive in a conformal power delivery structure (embedded passive structure) according to a first embodiment.
Figure 3:
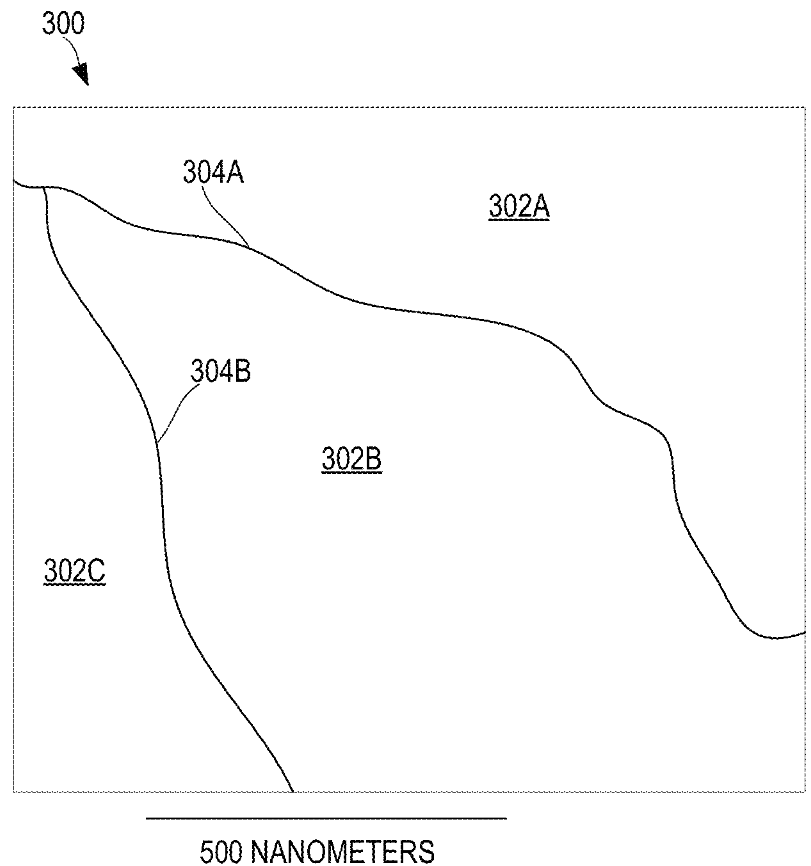
FIG. 3 illustrates a magnified view of a cold spray structure.
Figures 4, 5:
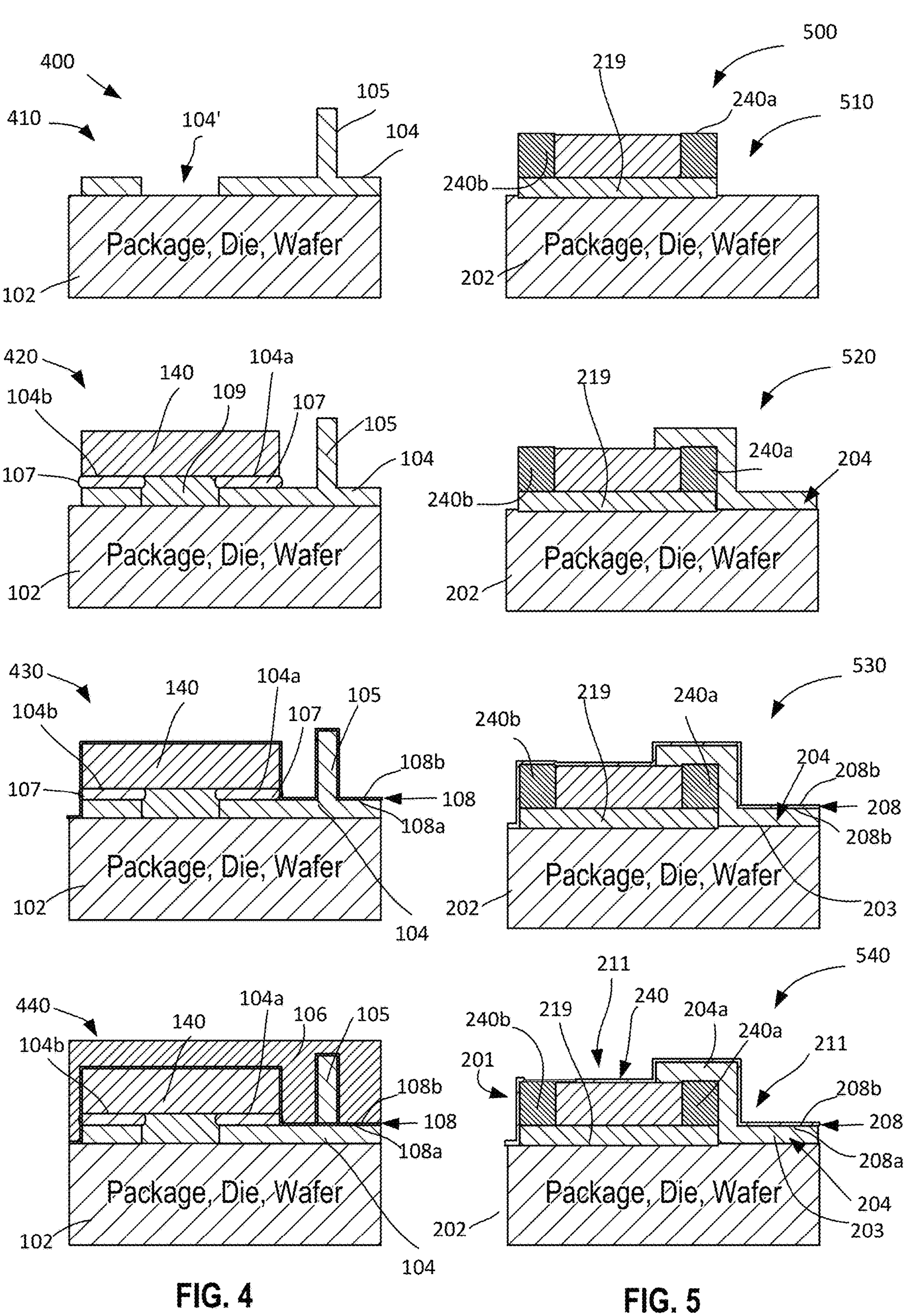
FIG. 4 illustrates stages of a process to make an embedded passive structure according to the embodiment of FIG. 1.
FIG. 5 illustrates stages of a process to make an embedded passive structure according to the embodiment of FIG. 2

Advantageously, an embedding process according to embodiments enables multiple attach techniques, for example, through solder assembly as depicted in the context of FIG. 1 and FIG. 3, or direct metal deposition, as depicted in the context of FIG. 2 and FIG. 4, to be described further below. This provides flexibility in selecting the best passive devices based on their electrical properties rather than on assembly and mechanical requirements. Therefore, higher power passive devices (e.g., inductors and transformers) embedded according to embodiments will have direct contact with a relatively thick conductive layer that may provide heat spreading functionality in addition to electrical connectivity.

Embodiments of an embedded passive structure and systems including the same according to some embodiments will be described below in the context of FIGS. 1, 2, and 4-9.

Although FIGS. 1, 2 and 4-9 show a passive device that corresponds to a capacitor, embodiments are not so limited, and include within their scope an embedding of any passive device in a manner as described in the context of those figures.

FIG. 1 illustrates an embedded capacitor 140 in an embedded passive structure (embedded passive structure) 100 according to a first embodiment. embedded passive structure 100 includes a conformal power delivery structure 110 into which a passive structure 140 has been embedded. Embedded passive structure 100 may be part of a larger integrated circuit device, or integrated circuit device assembly, or system, such as those shown respectively in FIGS. 11, 12 and 13, to be described further below.

Embedded passive structure 100 includes a base layer 102 (which may correspond to any support layer, including, for example, a package substrate, a die, or a wafer), a first power plane 104, which may be biased at a voltage level V1 at a first portion 104*a* thereof, and at a voltage level V2 at a second portion 104*b* thereof. The first power plane may be electrically and mechanically coupled to traces of the base layer (not shown), which may supply voltages V1 and V2. Alternatively, the first power plane may be electrically coupled to other voltage supply sources not shown in the figure. Capacitor 140 is adapted to be electrically coupled between V1 and V2, as shown by virtue of a first terminal 140*a* thereof electrically and mechanically coupled to power plane portion 104*a*, and of a second terminal 140*b* thereof electrically and mechanically coupled to power plane portion 104*b*. In the embodiment of FIG. 1, the capacitor 140 is shown as having been electrically and mechanically coupled to the first power plane by way of solder 107. An underfill material 109 may be provided between power plane portions 104*a* and 104*b* as shown. The first power plane includes interconnects 103, and vias 105 (one via having been shown, given that the view of FIG. 1 is merely a portion of a system).

In an embedded passive structure such as the embedded passive structure 100 shown in FIG. 1, a second power plane 106 is used to encapsulate capacitor 140. The second power plane corresponds to a HTAM layer, provided for example using cold spray. The second power plane 106 is a conformal power plane, as will be described below.

In particular, the example embedded passive structure 100 includes the conformal power delivery structure 101 which includes the first power plane 104 and the second power plane/HTAM layer 106 formed on the first power plane 104, with a liner 108 including a dielectric material between the first power plane 104 and second power plane 106. The liner 108 may include a dielectric liner 108*a* conformal with an upper surface of the first power plane 104 and the upper surface of the capacitor 140. The conformal power delivery structure 101 may be formed as described further below with respect to FIG. 3, or in another manner.

The HTAM material of the second power plane 106 may include an electrically conductive material, and may optionally also be electrically and mechanically coupled to traces of the base layer at exposed portions of the base layer not covered by the dielectric liner (not shown), or to other sources of voltage, which may supply one or more voltages V3 . . . Vn to portions of the second power plane 106. Similar to first power plane 104, second power plane 106 may therefore be configured to supply one or more voltages to other components of a system of which embedded passive structure 100 is a part.

As shown, the first power plane 104 of the conformal power delivery structure 101 is defined by a first electrically conductive portion (e.g., metal or a material comprising metal) including conductive traces or interconnects 104*a*/104*b* and vias 105. The first power plane 104 and the capacitor 140 together define a non-flat upper surface that defines one or more recesses 111. The second power plane/HTAM layer 106 is defined by a second electrically conductive portion (e.g., metal or a material comprising metal) that is within the recesses 111 such that the lower surface of the second power plane 106 generally conforms with the non-flat upper surface defined by a combination of the first power plane and the capacitor 140. Second power plane 106 along a x-y direction (see legend for example in FIG. 1) is co-planar with the first power plane and with the capacitor within the areas of the recesses 111.

As used herein, a first surface generally conforming to a second surface may refer to the first surface having the same or very similar shape as the first surface, with the first surface following along the surface of the second surface. For instance, in the example shown, the lower surface of the second power plane/HTAM layer 106 (the surface facing the first power plane 104 and the capacitor 140) has the same shape or contour as an exposed upper surface defined by a combination of the first power plane 104 and the capacitor 140 ("the exposed upper surface"—i.e., at least part of the surface facing the second power plane/HTAM layer 106). Thus, the liner 108 between the second power plane 106 and the exposed upper surface also has the same shape as the exposed upper surface. However, in some embodiments, due to manufacturing differences, tolerances, dielectric (or other layer) deposition methods, the conforming surfaces may not have the exact same shape as one another, but they may still be considered to be conforming in the sense that the lower surface of the upper plane 106 generally follows along with the exposed upper surface (and/or the liner 108 to the extent its shape is slightly different from that of the exposed upper surface).

The second power plane/HTAM layer 106 defines openings therethrough in which vias, such as via 105 of the first power plane 104 are disposed.

A dielectric layer 108*a* of liner 108 shown in FIG. 1 (and the same goes for a dielectric layer 108*a* of liner 108 shown in FIGS. 4, 6, 7, 8A-8C) is to provide an electrically insulating barrier between the second power plane and the first power plane, and, optionally, between the second power plane and the base layer. As suggested above, however, embodiments include scenarios where the dielectric layer 108*a* of liner 108 has been patterned to expose openings therein in registration with electrical connections of the base layer 102. Thus, the dielectric layer 108*a* of liner 108 may be patterned to selectively insulate the second power plane/HTAM layer 106 from electrical circuitries within the base layer 102 if any.

As used herein, the terms "upper"/"lower" or "above"/"below" may refer to relative locations of an object (e.g., the surfaces described above), especially in light of examples shown in the attached figures, rather than an absolute location of an object. For example, an upper surface of an apparatus may be on an opposite side of the apparatus from a lower surface of the object, and the upper surface may be facing upward generally only when viewed in a particular way. As another example, a first object above a second object may be on or near an "upper" surface of the second object rather than near a "lower" surface of the object, and the first object may be truly above the second object only when the two objects are viewed in a particular way.

Figure 11:
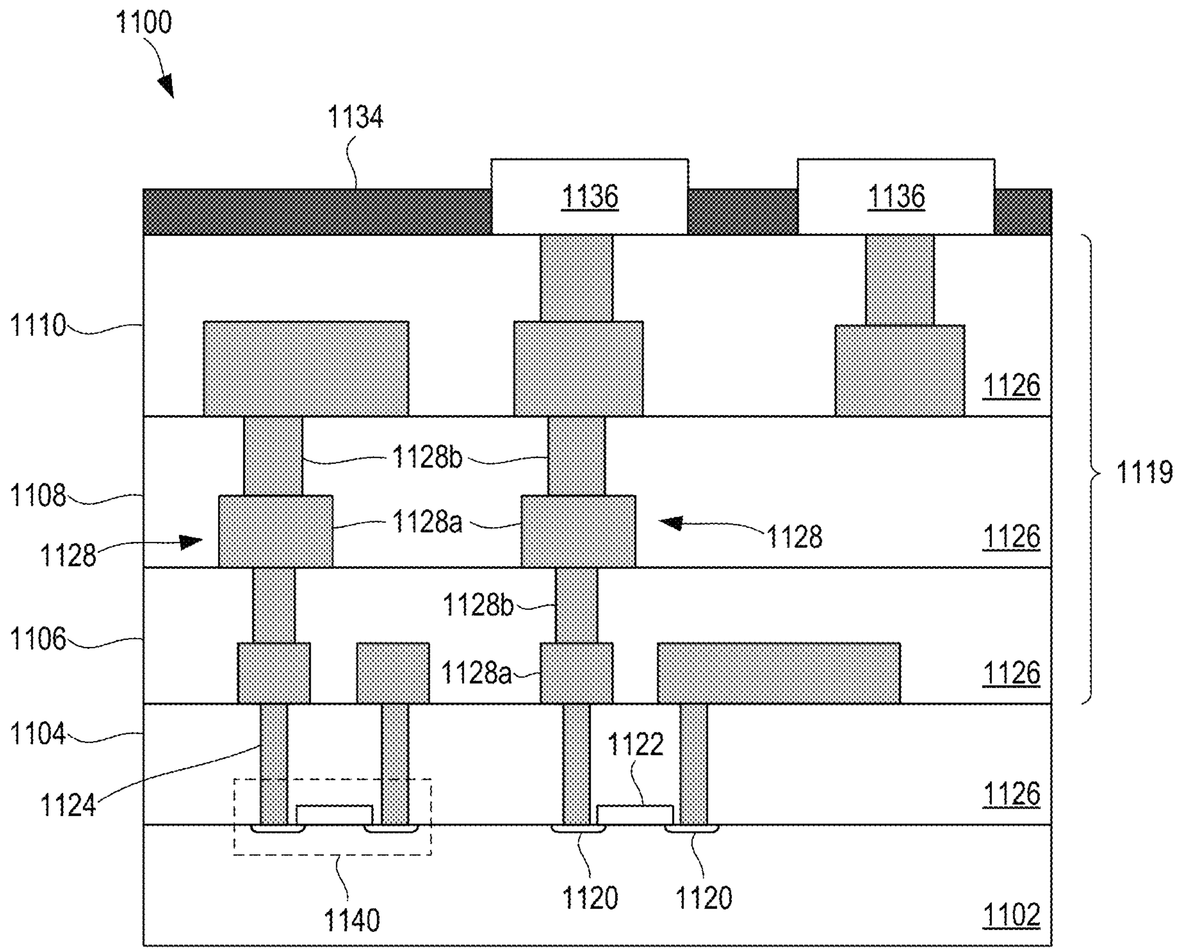
FIG. 11 is a cross-sectional side view of an integrated circuit device that may be included in a microelectronic assembly, in accordance with any of the embodiments disclosed herein.
Figure 12:
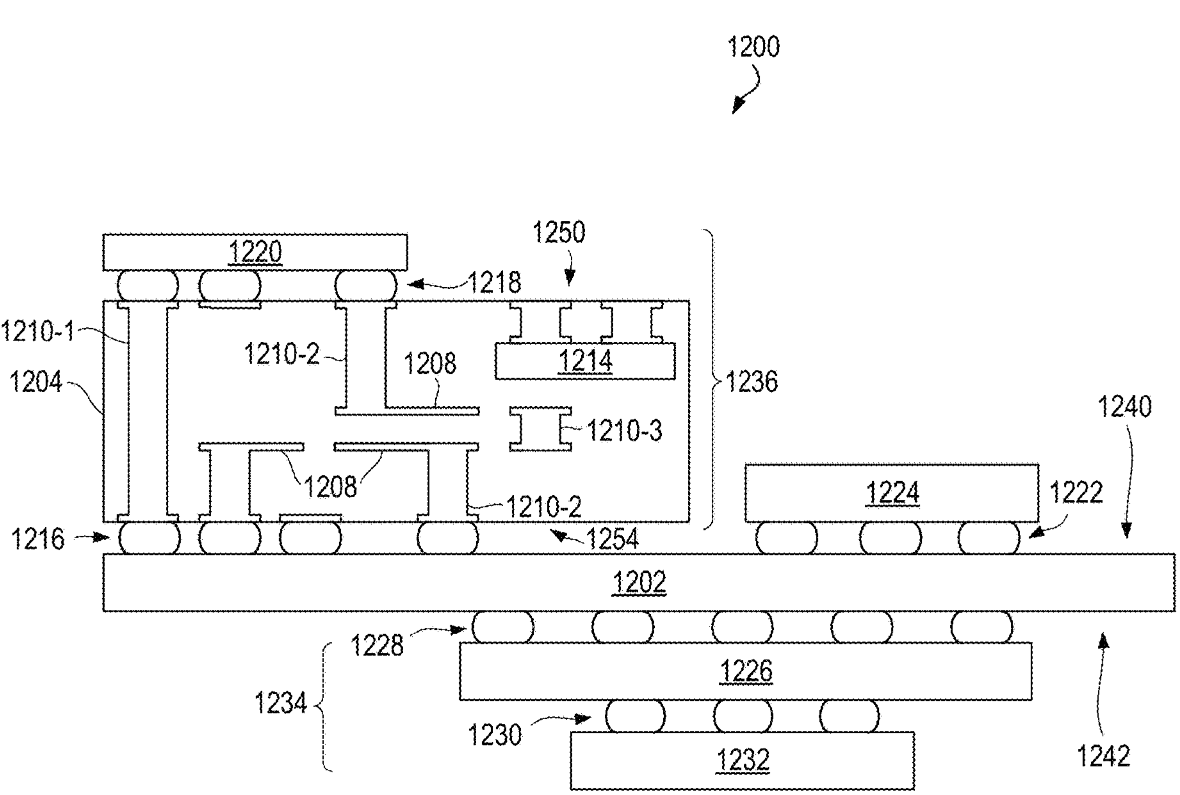
FIG. 12 is a cross-sectional side view of an integrated circuit device assembly that may include a microelectronic assembly, in accordance with any of the embodiments disclosed herein.

In the example shown, the conformal power delivery structure 101 not only allows an embedding of passive devices inside a microelectronic assembly, but also allows for power delivery to component circuitry of other components of an integrated circuit device or integrated circuit device assembly, such as those shown in FIGS. 11 and 12. An electrical connection through the second power plane to such other components is shown by way of example in FIGS. 6-9 to be described further below.

Liner 108 of embedded passive structure 100 may additionally include a buffer layer 108*b* above dielectric layer 108*a*, adjacent a lower surface of the second power plane/HTAM layer 106. In an embodiment that includes regions of upper surfaces of the base layer 102 electrically coupled to the second power plane 106, the buffer layer 108*b* may be disposed between and adjacent to the upper surface of the base layer 102 and the lower surface of the second power plane/HTAM layer 106, with the dielectric layer 108*b* patterned away/removed from such regions. The buffer layer may optionally extend onto side walls and portions of the upper surface of the interconnects 104*a*/104*b* and vias 105. Alternatively, there may be intervening layers between buffer layer 108*b* and any one of the second power plane/HTAM layer 106, the base layer 102, or surfaces of the interconnects 104*a*/104*b* and surfaces of the vias 105. Buffer layer 108*b* may be electrically conductive, and may be provided to mechanically protect underlying surfaces onto which a cold spray material, such as the material of second power plane 106, is to be deposited via a HTAM process, such as cold spray.

Although described herein as being power "planes", it will be understood that the power planes of the present disclosure may not be planar in the geometric sense (e.g., completely flat in one plane like traditional power planes). In addition, although shown as formed in a particular way (e.g., with two power planes), the conformal power delivery structure 101 may be formed in any suitable manner in accordance with the examples described herein (e.g., with three or more power planes, or with different via shapes, or no vias). Further, the conformal power delivery structure 101 may be included in any suitable location within a package. The power planes may also be used to deliver power from one die to another die on the same package (e.g., from a separate voltage regulator die to a processor die) or from outside the package (main board, battery, etc.) to the package and then to the die(s).

FIG. 2 shows an embedded capacitor 240 in an embedded passive structure 200 according to a second embodiment. A difference between the embodiments of FIGS. 1 and 2 is that, in FIG. 2, the capacitor 240 is attached to the base layer using a solderless attach procedure facilitated through the use of an adhesive 219, which brings with it a different configuration with respect to terminal connections as will be described further below.

Embedded passive structure 200 includes a conformal power delivery structure 210 into which a passive structure 240 has been embedded. Similar to embedded passive structure 100, embedded passive structure 200 may be part of a larger integrated circuit device, or integrated circuit device assembly, or system, such as those shown respectively in FIGS. 11, 12 and 13, to be described further below.

Embedded passive structure 200 includes a base layer 202 (which may correspond to any support layer, including, for example, a package substrate a die, or a wafer), a first power plane 204, which may be biased at a voltage level V1. The first power plane may be electrically and mechanically coupled to traces of the base layer (not shown), which may supply voltage V1. Alternatively, the first power plane may be electrically coupled to other voltage supply sources not shown in the figure. Capacitor 240 is adapted to be electrically coupled between V1 and V2, as shown by virtue of a first terminal 240*a* thereof electrically and mechanically coupled to power plane portion 204*a* of first power plane 204, and of a second terminal 240*b* thereof electrically and mechanically coupled to power plane portion 204*b*. An adhesive 219 may be provided under the capacitor 240 as shown in order to mechanically attach the capacitor 240 to the base layer 202 in a solderless manner.

In an embedded passive structure such as the embedded passive structure 200 shown in FIG. 2, a second power plane 206 is used to encapsulate capacitor 240. The second power plane corresponds to a HTAM layer, provided for example using cold spray. The second power plane 206 is a conformal power plane, as will be described below.

In particular, the example embedded passive structure 200 includes the conformal power delivery structure 201 which includes the first power plane 204 and the second power plane/HTAM layer 206 formed on the first power plane 204, with a liner 208 including a dielectric material between the first power plane 204 and second power plane 206. The liner 208 may include a dielectric liner 208*a* conformal with an upper surface of the first power plane 204 and the upper surface of the capacitor 240. The conformal power delivery structure 201 may be formed as described further below with respect to FIG. 3, or in another manner.

The HTAM material of the second power plane 206 may include an electrically conductive material, and may optionally also be electrically and mechanically coupled to traces of the base layer at exposed portions of the base layer not covered by the dielectric liner (not shown), or to other sources of voltage, which may supply a voltage V2 to portions of the second power plane 206. Similar to first power plane 204, second power plane 206 may further be configured to supply one or more voltages to other components of a system of which embedded passive structure 200 is a part.

As shown, the first power plane 204 of the conformal power delivery structure 201 includes a trace (e.g., metal or a material comprising metal). The first power plane 204 and the capacitor 240 together define a non-flat upper surface that defines a recess 211. The second power plane/HTAM layer 206 is defined by a second electrically conductive portion (e.g., metal or a material comprising metal) that is within the recesses 211 such that the lower surface of the second power plane 206 generally conforms with the non-flat upper surface defined by a combination of the first power plane and the capacitor 240. Second power plane 206 along a x-y direction (see legend for example in FIG. 2) is co-planar with the first power plane and with the capacitor within the areas of at least some of the recesses 211.

As used herein, a first surface generally conforming to a second surface may refer to the first surface having the same or very similar shape as the first surface, with the first surface following along the surface of the second surface. For instance, in the example shown, the lower surface of the second power plane/HTAM layer 206 (the surface facing the first power plane 204 and the capacitor 240) has the same shape or contour as an exposed upper surface defined by a combination of the first power plane 204 and the capacitor 240 ("the exposed upper surface") (i.e. at least part of the surface facing the second power plane/HTAM layer 206). Thus, the liner 208 between the second power plane 206 and the exposed upper surface also has the same shape as the exposed upper surface. However, in some embodiments, due to manufacturing differences, tolerances, dielectric (or other layer) deposition methods, the conforming surfaces may not have the exact same shape as one another, but they may still be considered to be conforming in the sense that the lower surface of the upper plane 206 generally follows along with the exposed upper surface (and/or the liner 208 to the extent its shape is slightly different from that of the exposed upper surface).

The second power plane/HTAM layer 206 may define openings therethrough for vias (not shown) to allow a direct electrical coupling with the base layer.

Figure 9:
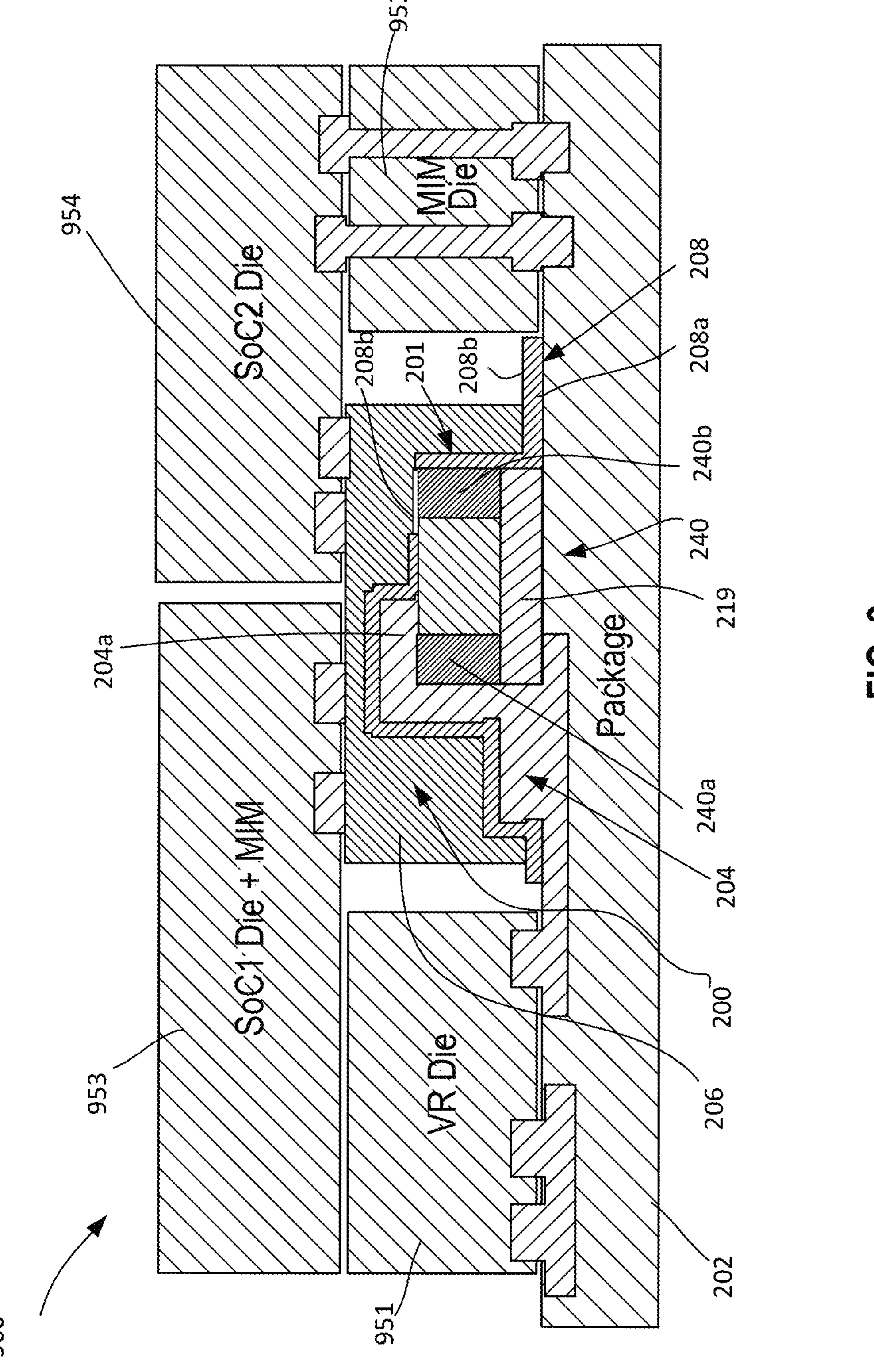
FIG. 9 shows a third embodiment of a microelectronic system including a portion of a package assembly that comprises an embedded passive structure according to the embodiment of FIG. 2.

A dielectric layer 208*a* of liner 208 is shown in FIG. 2 (and the same goes for a dielectric layer 208*a* of liner 208 shown in FIGS. 5 and 9) is to provide an electrically insulating barrier between the second power plane and the first power plane, and, optionally, between the second power plane and the base layer. The dielectric layer 208*a* of liner 208 is shown as having been patterned to expose terminal 240*b*, such that second power plane 206 can electrically contact terminal 240*b*. Buffer layer 208*b*, which will be described further below, may be provided on the terminal 240*b*, but, given its electrically conductivity, would allow the electrical coupling between the second conductive plane and the capacitor 240. Buffer layer 208*b* may be electrically conductive, and may be provided to mechanically protect underlying surfaces onto which a cold spray material, such as the material of second power plane 206, is to be deposited via a HTAM process, such as cold spray.

Further, as suggested above, embodiments include scenarios where the dielectric layer 208*a* of liner 208 has been patterned to expose openings therein in registration with electrical connections of the base layer 202. Thus, the dielectric layer 208*a* of liner 208 may be patterned to selectively insulate the second power plane/HTAM layer 206 from electrical circuitries within the base layer 202 if any.

In the example shown, the conformal power delivery structure 201 not only allows an embedding of passive devices inside a microelectronic assembly, but also allows for power delivery to component circuitry of other components of an integrated circuit device or integrated circuit device assembly, such as those shown in FIGS. 11 and 12. An electrical connection through the second power plane to such other components is shown by way of example in FIGS. 6-9 to be described further below.

Liner 208 of embedded passive structure 200 may additionally include, as noted above, a buffer layer 208*b* above dielectric layer 208*a*, adjacent a lower surface of the second power plane/HTAM layer 206. In the shown embodiment, where terminal 240*b* is electrically coupled to the second power plane 206, the buffer layer 208*b* is disposed between and adjacent to the upper surface of the terminal 240*b* and the lower surface of the second power plane/HTAM layer 206, with the dielectric layer 208*b* patterned away/removed from such regions. Additionally, in an embodiment that includes regions of upper surfaces of the base layer 202 electrically coupled to the second power plane 206 (now shown), the buffer layer 208*b* may be disposed between and adjacent to the upper surface of the base layer 202 and the lower surface of the second power plane/HTAM layer 206, with the dielectric layer 208*b* patterned away/removed from such regions. The buffer layer may optionally extend onto side walls and portions of the upper surface of the first power plane 201. Alternatively, there may be intervening layers between buffer layer 208*b* and any one of the second power plane/HTAM layer 206, the base layer 202, or surfaces of the first power plane 204.

Referring to the power delivery structure of FIGS. 1, 2, and 4-9, a portion of the second power plane/HTAM layer 106/206, or "conformal power plane" 106/206 may be, at least in part, provided by way of a cold spray process. Hence the second power plane/HTAM layer may be referred to as an "HTAM layer," which may include one or more layers provided through a HTAM technique, such as cold spray.

Cold spraying (CS) is a coating deposition method, where solid powders (typically about 1 to 100 microns in diameter) are accelerated in a supersonic gas jet to velocities up to about 1200 m/s. During impact with the target surface, particles undergo plastic deformation and adhere to the target surface. The solid powders of the desired material or material mixtures to be deposited in cold spray are accelerated in a carrier gas jet (e.g. compressed air or $N_2$) by passing the jet through a converging diverging nozzle. To achieve a uniform thickness, the spraying nozzle may be scanned along the target surface. Subsequent layers of the material similarly adhere to each underlying layer upon continued jet impact, producing fast buildup (e.g. layers that are few 100s of microns thick can be deposited over an area of 100-1000 $mm^2$ in seconds). The kinetic energy of the particles, supplied by the expansion of the gas, is converted to plastic deformation energy during bonding. Unlike thermal spraying techniques, such as plasma spraying, arc spraying, flame spraying, or high velocity oxygen fuel (HVOF), the powders are in general not melted during the spraying process, thus presenting the signature physical features to be described below. Metals, polymers, ceramics, composite materials including metals and non-metals, and nanocrystalline powders can be combined as feed powder, and deposited as a composite, hybrid layer using cold spraying in a single operation.

A material structure provided by way of cold spraying (cold spray structure, which in the case of FIGS. 1, 2 and 4-9 includes the conformal power plane 106/206, may present signature physical features and/or may be accompanied by signature physical features of surrounding structures, for example as discernible through a cross section viewed with the use of electron microscopy, such as a scanning electron microscopy (SEM) or transmission electron microscopy (TEM). The signature physical features may include a non-amorphous, granular microstructure including disordered or randomly distributed grains or particles.

The particles may each have dimensions in the order of from 1 micron to 10s of microns up to about 100 microns, and may present substantially non-linear particle to particle interfaces, for example when viewed at high magnification as noted above, for example a magnification at a scale of about 500 nm. The particle to particle interfaces are "substantially non-linear" as compared with particle to particle interfaces of plated metal materials when viewed at a same magnification. The cold sprayed material may further have a maximum porosity of 5% throughout. Signature physical features of surrounding structures may include the presence of a buffer layer, such as buffer layer 108*b*/208*b*.

The buffer layer may be provided by way of, for example, electroplating or physical vapor deposition, and may include a first layer including, for example, titanium or tantalum, and a second layer over the first layer and disposed adjacent the cold sprayed material structure, the second layer including, by way of example, a soft metal such as indium, silver, gold, tin, lead, and related alloys. The buffer layer may, for example, include one or more of nickel (Ni), vanadium (V), nickel vanadium (NiV), or other materials, and may have a total thickness less than about 500 nm.

A cold spray structure in general is best not to be deposited directly on certain surfaces, such as dielectric surfaces of the package substrate, or such as semiconductor surfaces of a die, since the cold spray delivers particles at a high speed, for example supersonic speeds. Such particles may likely crater and damage a dielectric or semiconductor material. A thin buffer layer including titanium topped with gold, or titanium topped with copper would largely avoid the latter consequence, by both adhering to the dielectric or semiconductor material (e.g. by virtue of the titanium), and by providing a soft-enough layer on top that would allow for the cold spray material to be deposited on top of it without damaging the underlying dielectric or semiconductor material.

When viewed at high magnification, for example through electron microscopy, the interface between the buffer layer and the cold spray structure of the second power plane/HTAM layer/conformal power plane may present a non-flat configuration, for example as compared with an interface between power planes and the underlying dielectric. In the non-flat configuration, some particles of the cold-spray structure are at least in part embedded within indentations of the upper material of the buffer layer. It is for this reason that a soft metal used as the upper material of the buffer layer would be beneficial to receive a cold sprayed material formed thereon in an additive manner, as it would allow a secure bonding of the cold sprayed structure to the underlying layer.

Referring now to FIG. 3, in one embodiment, an illustration 300 of a magnified view of a cold spray structure (such as the conformal power plane 106/206) is shown. The illustration 300 has a scale in the form of a line at the bottom, which has a width of 500 nanometers. The illustration shows several particles 302, such as particle 302A, particle 302B, and particle 302C. In the illustrative embodiment, each particle 302A-C has a length, width, height, and/or diameter of, e.g., 10-100 microns. Particle boundaries (such as particle boundary 304A, 304B) are present between the various particles 302A-C. The particle boundaries are visible in, e.g., a scanning electron microscope image taken of a cross-section of a cold spray structure.

Examples of HTAM materials that may be cold sprayed to provide the HTAM layer, such as the HTAM layer in the embodiments of FIGS. 2-4 described above, may include copper, aluminum, and combinations or composites including metals and non-metal particles, e.g., diamond, silicon carbide, or aluminum nitride.

FIG. 4 illustrates an example process for manufacturing embedded passive structure 100 of FIG. 1 in accordance with some embodiments. For the sake of clarity and consistency, components FIG. 4 have been referred to in that figure with the very same reference numerals as those used to refer to corresponding components in FIG. 1. Some components of the structure of FIG. 1 already described above may be shown and referenced in FIG. 4 without a further description of the same, given the correspondence of those components with those shown in FIG. 1.

The example process 400 is a simplified process and illustrates only certain steps that may be performed for manufacturing a conformal power delivery structure in accordance with the present disclosure. In some cases, the process 400 may include fewer, additional, or different operations/steps than those illustrated and described below.

In a solder attach process, an example of which is depicted in FIG. 4, starting with a pre-patterned base layer, the passive devices may be attached using solder attach and an underfill material may optionally be applied to provide mechanical stability. A thin dielectric and HTAM buffer layer may be deposited over the metal features and the passive devices. The HTAM process may then be performed to provide the material of the second power plane, which is the HTAM layer/conformal power plane. An optional planarization step may be performed to expose the through connections and to yield the second power plane as a result. These operations are described in more detail below.

At 410, a metal structure is provided on a base layer 102 to yield first power plane 104. The base layer may be a printed circuit board (PCB), wafer, package, die, etc, and the metal structure may include be any suitable conducting metal, such as, for example, copper, aluminum, titanium, etc. By way of example, the metal structure may be provided by first depositing a metal layer extending on the upper surface of base layer 102, for example using electroplating or even HTAM, patterning the same to define opening 104' therein, and thereafter providing a via 105 in any known manner.

At 420, a capacitor 140 may be electrically and mechanically coupled to the first power plane 104 by way of solder 107, such that terminals 140*a* and 140*b* of the capacitor 140 are coupled to interconnects 104*a* and 104*b* of the first power plane, respectively. An underfill material 109 may further be provided in recess 104' between the capacitor and the base layer 102 in known manner.

At 430, a liner 108 may be deposited over the exposed upper surface of the combination of the interconnects 104*a* and 104*b*, and of the capacitor 140, and optionally of the base layer, to yield the liner 108. Deposition of liner 108 may include an initial deposition of a dielectric layer 108*a*, followed by the provision of a buffer layer 108*b* thereon. In embodiments where an electrical connection to the base layer is needed to the second power plane 206, the dielectric layer may be patterned to define openings therein in registration with contacts on the base layer 102. A patterning of dielectric layer 108*a* may take place before provision of buffer layer 108*b*.

Dielectric layer 108*a* of liner 108 will be useful to electrically insulate the second power plane 106 from the underlying components including the first power plane 104, the capacitor 140, the base layer 102. As noted previously, it is not necessary that the dielectric layer 108*a* extend over the entirety of the capacitor 140 as shown, as long as it covers the surfaces of the first power plane 104 and portions of the solder to provide electrical insulation between the second power plane 106 and desired surfaces of components underlying the same. The dielectric layer 108 may be formed using an organic dielectric material, such as, for example, silica filled epoxy or inorganic dielectric such as $Si_3N_4$, $TiO_2$, $HfO_2$, SiCN, $SiO_2$, AlN, $Al_2O_3$ or other similar materials or combinations of different layers. The dielectric layer may be patterned if desired, for example using laser ablation. Deposition of buffer layer 108*b* over dielectric layer 108*a* may take place using any suitable technique, such as sputtering.

At 440, a metal layer is deposited over the assembly shown in the context of operation 430, to provide the second power plane/HTAM layer 106. The metal layer 106 forms the second power plane/HTAM layer of the conformal power delivery structure. The metal layer 106 may be blanket deposited, for example using cold spray, and may optionally be patterned where desired (not shown) through HTAM patterning or lithographic patterning including etching. The deposited metal layer 106 may be a pure metal (e.g., copper, aluminum, etc.) or a composite (e.g., copper with diamond or silicon carbide fillers) e.g., for improved mechanical and/or thermal performance. Any conventional technique may be used to provide the via holes, such as laser drill the via holes. After deposition of the metal layer 106, a top surface of the assembly may be planarized, for example through back grinding if necessary, to yield the embedded passive structure 100 of FIG. 1.

FIG. 5 illustrates an example process for manufacturing embedded passive structure 200 of FIG. 2 in accordance with some embodiments. For the sake of clarity and consistency, components FIG. 5 have been referred to in that figure with the very same reference numerals as those used to refer to corresponding components in FIG. 2. Some components of the structure of FIG. 2 already described above may be shown and referenced in FIG. 5 without a further description of the same, given the correspondence of those components with those shown in FIG. 2.

In a solderless attach process, an example of which is depicted in FIG. 5, the passive devices are attached to the base layer 102 through an adhesive (e.g., epoxy, silica filled polymer, die attach film etc.). Connections are made to the passive devices through lithographically, e.g., by electroplating over some of the device terminals (deposit blanket seed layer, deposit, expose & develop a photoresist, electroplate, strip photoresist and etch seed). It may also be deposited through an HTAM process. A thin dielectric layer and a buffer layer are deposited over the structure. The thin layer is then ablated to expose the other terminals of the passive devices. The top metal deposition of the HTAM layer/conformal power delivery structure is then performed, and an optional grinding step may also be performed to yield the second power plane.

The example process 500 is a simplified process and illustrates only certain steps that may be performed for manufacturing a conformal power delivery structure in accordance with the present disclosure. In some cases, the process 500 may include fewer, additional, or different operations/steps than those illustrated and described below.

At 510, a capacitor 240 may be mechanically attached to a base layer 202 using a solderless attach process. The base layer may be a printed circuit board (PCB), wafer, package, die, etc, and the metal structure may include be any suitable conducting metal, such as, for example, copper, aluminum, titanium, etc. An adhesive material 219 is provided between the capacitor 240 and the base layer 202 in order to aid in the solderless attach of the capacitor and the base layer.

At 520, a metal structure is provided on base layer 202 to yield first power plane 204. By way of example, the metal structure may be provided by using electroplating or even HTAM, patterning the same to define opening 204' therein.

At 530, a dielectric layer **208*a* may be deposited over the exposed upper surface of the combination of the first power plane and the capacitor 240, and optionally of the base layer 202. Dielectric layer 208*a* will be useful to electrically insulate the second power plane 206 from desired regions of the underlying components including the first power plane 204, the capacitor 240, the base layer 202**.

At 540, a patterning of the dielectric layer **208*a* may take place, along with deposition and patterning of a buffer layer to yield buffer layer 208*b*. Patterning of dielectric layer 208*a* may initially result in the creation of an opening in the region of the second terminal 240*b* that is to be electrically coupled to the second power plane 206. Deposition of the buffer layer 208*b* may cover this opening, and may further cover remaining portions of the dielectric layer 208*a*. Buffer layer 208*b* may be useful to mechanically protect underlying surfaces onto which a cold spray material, such as the material of second power plane 206**, is to be deposited via a HTAM process, such as cold spray.

As noted previously, it is further not necessary that the dielectric layer **208*a* extend over the entirety of the capacitor 240 as shown, as long as it covers the surfaces of the first power plane 204 and portions of the solder to provide electrical insulation between the second power plane 206 and desired surfaces of components underlying the same. The dielectric layer 208 may be formed using an organic dielectric material, such as, for example, silica filled epoxy or inorganic dielectric such as $Si_3N_4$, $TiO_2$, $HfO_2$, SiCN, $SiO_2$, AlN, $Al_2O_3$ or other similar materials or combinations of different layers (e.g., as a barrier or improved capacitor electrodes). The dielectric layer may be patterned if desired, for example using laser ablation. Deposition of buffer layer 208*b* over dielectric layer 208*a*** may take place using any suitable technique, such as sputtering.

After operation 540, a metal layer may be deposited over the assembly shown in the context of operation 540, to provide the second power plane/HTAM layer 206. The metal layer 206 forms the second power plane/HTAM layer of the conformal power delivery structure. The metal layer 206 may be deposited for example using cold spray, and may optionally be patterned where desired (not shown) through HTAM patterning or lithographic patterning including etching. The deposited metal layer 206 may be a pure metal (e.g., copper, aluminum, etc.) or a composite (e.g., copper with diamond or silica fillers) e.g., for improved mechanical and/or thermal performance. After deposition of the metal layer 206, a top surface of the assembly may be planarized, for example through back grinding if necessary, to yield the embedded passive structure 200 of FIG. 2.

As described above in the context of FIGS. 1, 2, 4 and 5, embodiments propose embedding passive devices such as capacitors, inductors, transformers, integrated passive devices (IPDs), etc. inside a relatively thick HTAM layer/second power plane. The passive devices may be prefabricated, or they may themselves be made using a HTAM technique.

As compared with standard embedding, embodiments enable embedding the passive devices in a relatively stiff environment which helps: (1) isolate the passive devices from package stresses and (2) reduce the impact of the passive devices embedding on the mechanical properties of the package as is the case with standard embedded passive devices in package layers. Embodiments further enable multiple attach techniques, e.g., through solder assembly (e.g. FIG. 4) or direct metal deposition (e.g. FIG. 5). This provides flexibility in selecting the best passive devices based on their electrical properties rather than based on assembly and mechanical requirements.

Figures 6, 7:
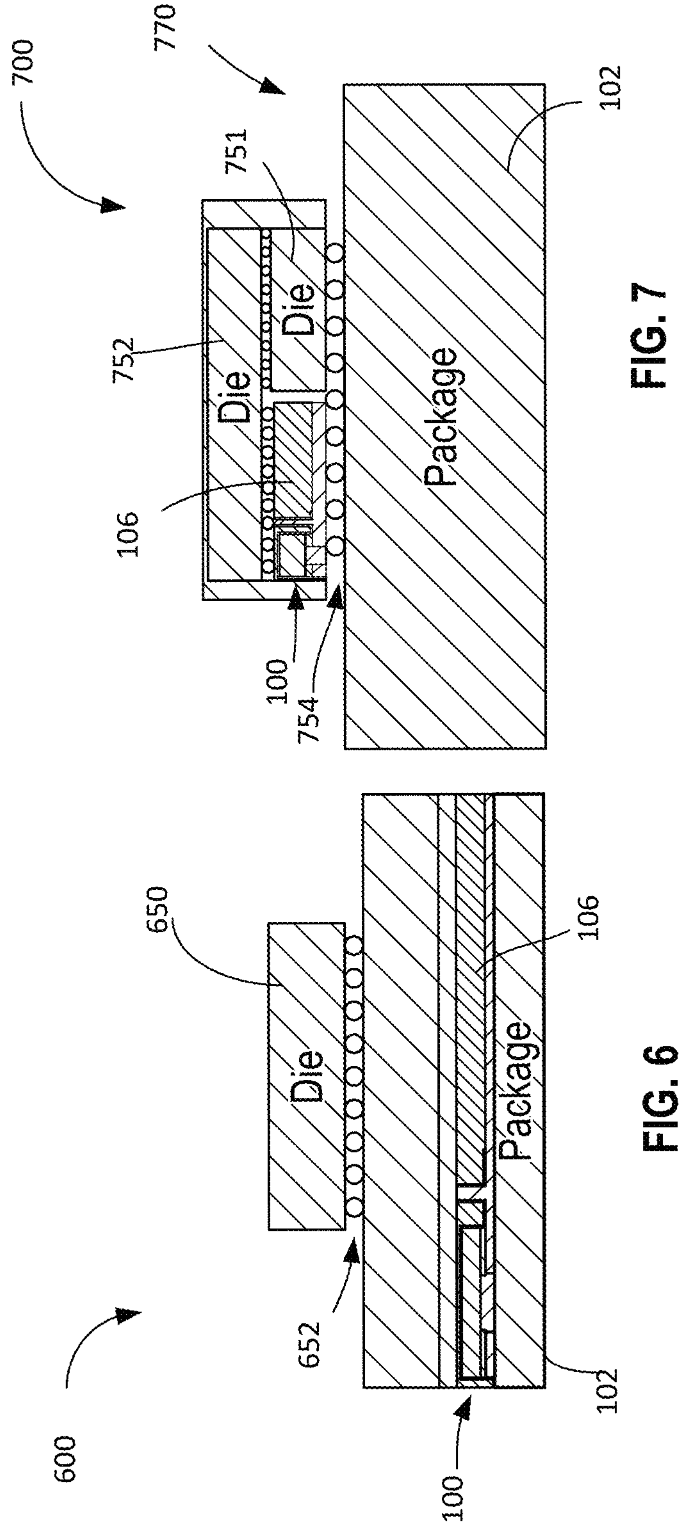
FIG. 6 shows a first embodiment of a microelectronic system including a portion of a package assembly that comprises an embedded passive structure according to the embodiment of FIG. 1.
FIG. 7 shows a second embodiment of a microelectronic system including a portion of a package assembly that comprises an embedded passive structure according to the embodiment of FIG. 1.

The microelectronic systems of FIGS. 6 and 7 include a embedded passive structure similar to the embedded passive structure 100 of FIG. 1. While in FIG. 6, the embedded passive structure is shown as having been embedded in a circuit board, in FIG. 7, the embedded passive structure is shown as having been integrated into a stacked die assembly. In the microelectronic systems of FIGS. 6 and 7, package substrate 102 corresponds to a circuit board that may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board. In other embodiments, the circuit board may be a non-PCB substrate. In each of the microelectronic assemblies of FIGS. 6 and 7, the shown dies mounted on the circuit board may include one or more circuitry components, such as voltage regulator circuitry, memory circuitry, and/or processor circuitry. In some instances, the dies in embodiments may include only one type of circuitry components thereon. In other instances, each of the different circuitry components may be housed in a separate die instead of one die as shown. In some embodiments, the die may be implemented as a die stack, or may be implemented as several different dies on an organic or inorganic interposer apparatus (e.g., with each die comprising different circuitry).

FIG. 6 shows a first embodiment of a microelectronic system including a portion of a package assembly that comprises an embedded passive structure according to the embodiment of FIG. 1, where the embedded passive structure is embedded in the package substrate 102. For the sake of clarity and consistency, components FIG. 6 have been referred to in that figure with the very same reference numerals as those used to refer to corresponding components in FIG. 1. Some components of the structure of FIG. 1 already described above may be shown and referenced in FIG. 7 without a further description of the same, given the correspondence of those components with those shown in FIG. 1.

In the microelectronic system 600 of FIG. 6, an embedded passive structure 100 is shown as having been embedded between buildup layers of a microelectronic package substrate 102. The second power plane 106 extends throughout at least a portion of a thickness of the package substrate 102, and may be used at regions thereof to couple traces within the package substrate to one another. A die 650 is shown as having been coupled to the package substrate through connections 652, such as a controlled collapse chip connection (C4) array.

FIG. 7 shows a second embodiment of a microelectronic system including a portion of a package assembly that comprises an embedded passive structure according to the embodiment of FIG. 1, where the embedded passive structure is embedded in a stacked die assembly, and attached at the backside of one of the dies in the stacked die assembly. For the sake of clarity and consistency, components FIG. 7 have been referred to in that figure with the very same reference numerals as those used to refer to corresponding components in FIG. 1. Some components of the structure of FIG. 1 already described above may be shown and referenced in FIG. 7 without a further description of the same, given the correspondence of those components with those shown in FIG. 1.

In the microelectronic system 700 of FIG. 7, an embedded passive structure 100 is shown as having been embedded within a stacked die assembly 770 including a first die 751 and a second die 752 coupled to one another by way of connectors such as ball grid arrays 754. The stacked die assembly 770 further includes the embedded passive structure 100, and is coupled to the package substrate 102 by way of a ball grid array 754.

The second power plane 106 extends throughout at least a portion of a thickness of the stacked die assembly 770, and may be used at regions thereof to couple traces within the package substrate to the stacked die assembly.

Figures 8A, 8B, 8C:
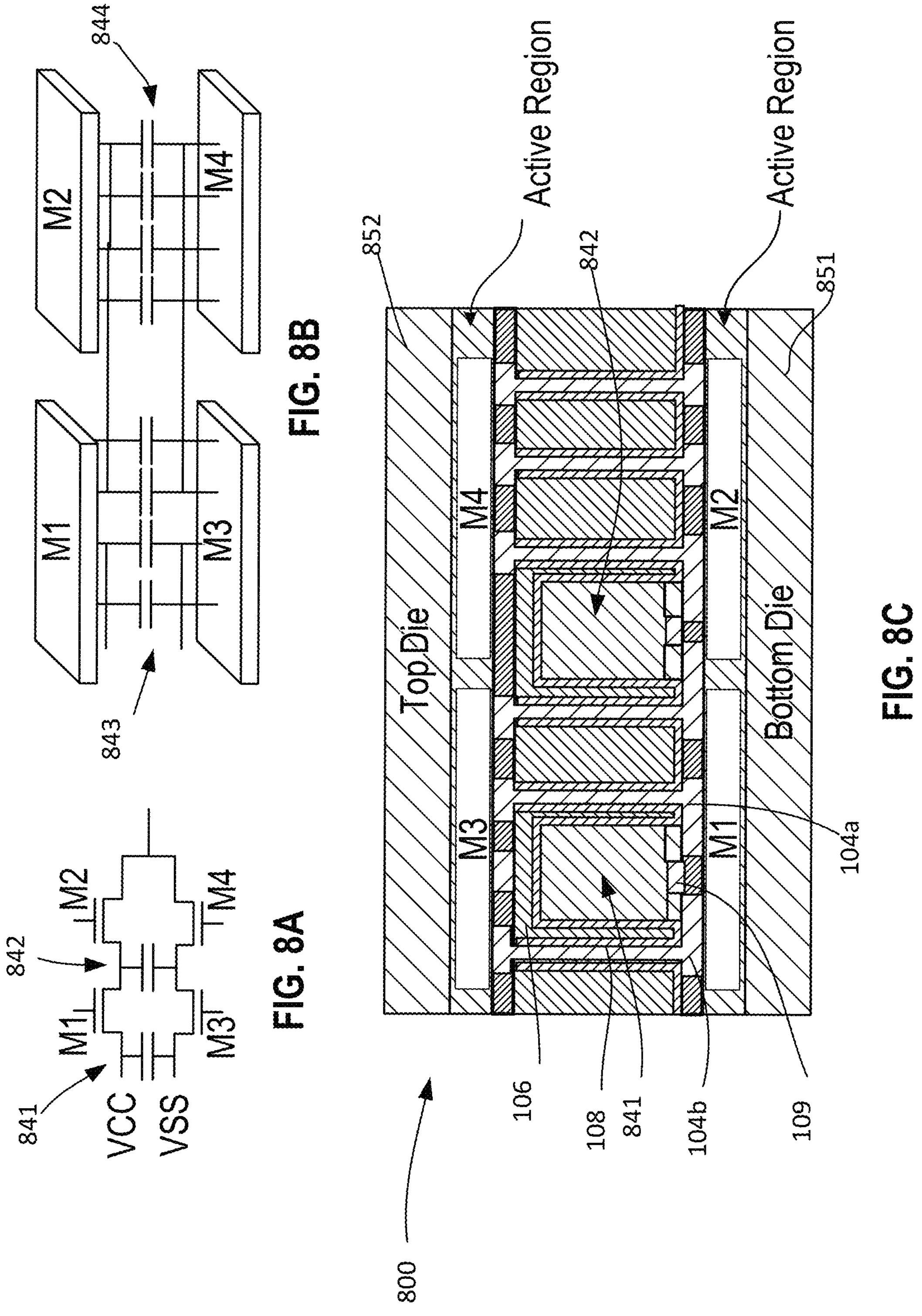
FIG. 8A is a circuit level schematic representation of a portion of an electronic circuit including embedded capacitors connected between a set of four transistors according to an embodiment.
FIG. 8B is a circuit level schematic representation similar to FIG. 8A, but with a large number of capacitors between the four transistors according to another embodiment.
FIG. 8C is shows portion of an electronic circuit according to the embodiment of FIG. 8A, including embedded capacitors according to the embodiment of FIG. 1.

FIG. 8A is a circuit level schematic representation of a portion of an electronic circuit including embedded capacitors connected between a set of four transistors according to an embodiment. FIG. 8B is a circuit level schematic representation similar to FIG. 8A, but with a larger number of capacitors between the four transistors according to another embodiment. FIG. 8C shows portion of an electronic circuit according to the embodiment of FIG. 8A, including embedded capacitors according to the embodiment of FIG. 1. For the sake of clarity and consistency, components FIGS. 8A-8C have been referred to in those figures with the very same reference numerals as those used to refer to corresponding components in FIG. 1 Some components of the structure of FIG. 2 already described above may be shown and referenced in FIGS. 8A-8C without a further description of the same, given the correspondence of those components with those shown in FIG. 1.

FIGS. 8A and 8C show a microelectronic system 800 including voltage regulator (VR) architecture that uses switched capacitors and partial voltage regulators (VRs) segregated onto multiple dies. In FIGS. 8A-8C, two embedded passive structure similar to embedded passive structure 100 lie between stacked die providing a low impedance path to the embedded passive devices while also functioning as a low resistive ground (VSS) path for the VR circuit. In the shown system 800, four transistors M1-M4 are disposed in active regions of the microelectronic system, between a bottom die 851 and a top die 852. Embedded passive structure 841 is connected between M1 and M3, while embedded passive structure 842 is connected between M2 and M4 as shown. A terminal of capacitor 841 is held at VCC, while the other terminal is held at VSS. VCC corresponds to a terminal of M1, while VSS to a terminal of M3.

FIG. 8B in particular shows an embodiments similar to that of FIG. 8A, except that it includes multiple embedded passive structures 843 and 844 coupled between M1 and M3 on the one hand, and M2 and M4 on the other hand, where each set of embedded passive structure includes four embedded passive structure each including a capacitor.

FIG. 9 shows a microelectronic system 900 including a single VR die on top of a embedded passive structure similar to embedded passive structure 200 of FIG. 2, except that, in FIG. 9, the passive device 240 may be an inductor 240. A power distribution medium in the form of second power plane 206 is to not only supply a voltage to one terminal of the inductor 240, but it is to further supply power to two top system-on-chip (SoC) die 953 and 954. In the shown embodiments, die 952 includes a system-on-a-chip die associated with a metal insulator metal (MIM) capacitor component. Assembly 900 further includes a VR die 951 and a MIM die 952 at the level of the embedded passive structure 200. The power distribution medium formed by the second power plane 206 in FIG. 9 advantageously provides a low resistive path to the SoCs.

In certain embodiments, the techniques described above may be used to deposit additional metal layers to form fourth, fifth, sixth, or more power planes in a conformal power delivery structure. For instances, aspects of the process 400 of FIG. 4, or aspects of process 500 of FIG. 5 may be combined to produce a conformal power delivery structure that provides access to three (or more) power planes on both the top and bottom sides of the conformal power delivery structure, and that embeds multiple passive devices therein.

Figure 10:
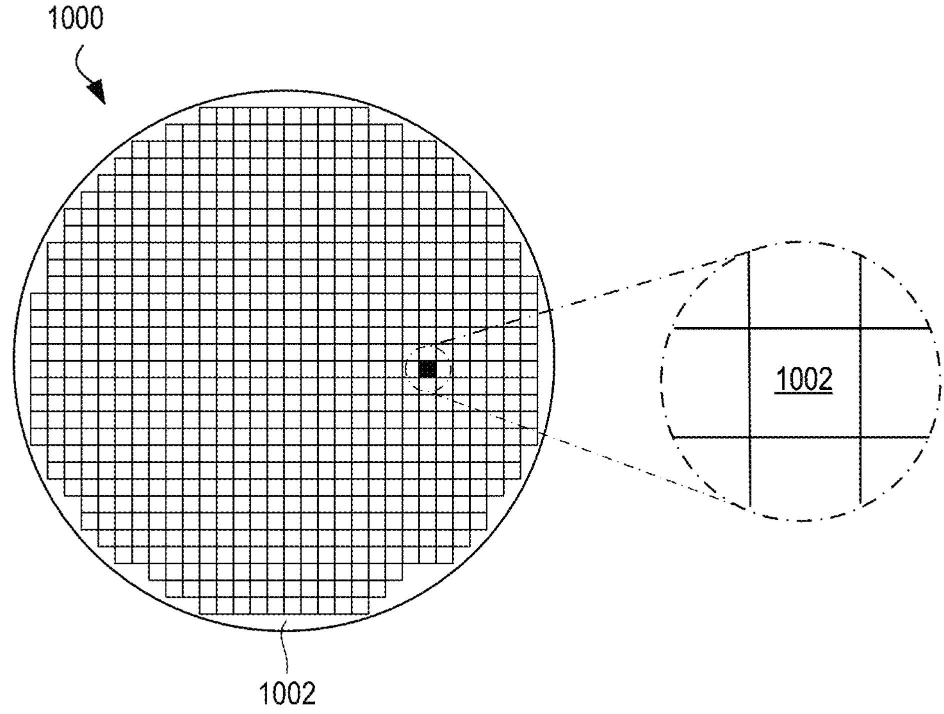
FIG. 10 is a top view of a wafer and dies that may be included in a microelectronic assembly, in accordance with any of the embodiments disclosed herein.

FIG. 10 is a top view of a wafer 1000 and dies 1002 that may be included in a package that may include any of the embedded passive structures according to embodiments as disclosed herein. The wafer 1000 may be composed of semiconductor material and may include one or more dies 1002 having integrated circuit structures formed on a surface of the wafer 1000. The individual dies 1002 may be a repeating unit of an integrated circuit product that includes any suitable integrated circuit. After the fabrication of the semiconductor product is complete, the wafer 1000 may undergo a singulation process in which the dies 1002 are separated from one another to provide discrete "chips" of the integrated circuit product. The die 1002 may include one or more transistors (e.g., some of the transistors 1140 of FIG. 11, discussed below), supporting circuitry to route electrical signals to the transistors, passive components or devices (e.g., signal traces, resistors, capacitors, or inductors), and/or any other integrated circuit components. In some embodiments, the wafer 1000 or the die 1002 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1002. For example, a memory array formed by multiple memory devices may be formed on a same die 1002 as a processor unit (e.g., the processor unit 1302 of FIG. 13) or other logic that is configured to store information in the memory devices or execute instructions stored in the memory array. Various embodiments disclosed herein may be manufactured using a die-to-wafer assembly technique in which some dies are attached to a wafer 1000 that include others of the dies, and the wafer 1000 is subsequently singulated.

FIG. 11 is a cross-sectional side view of a microelectronic system including an integrated circuit device 1100 that may be made part of a package that includes any of the embedded passive structures disclosed herein. One or more of the integrated circuit devices 1100 may be included in one or more dies 1002 (FIG. 10). The integrated circuit device 1100 may be formed on a die substrate 1102 (e.g., the wafer 1000 of FIG. 10) and may be included in a die (e.g., the die 1002 of FIG. 10). The die substrate 1102 may be a semiconductor substrate composed of semiconductor material systems including, for example, n-type or p-type materials systems (or a combination of both). The die substrate 1102 may include, for example, a crystalline substrate formed using a bulk silicon or a silicon-on-insulator (SOI) substructure. In some embodiments, the die substrate 1102 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1102. Although a few examples of materials from which the die substrate 1102 may be formed are described here, any material that may serve as a foundation for an integrated circuit device 1100 may be used. The die substrate 1102 may be part of a singulated die (e.g., the dies 1002 of FIG. 10) or a wafer (e.g., the wafer 1000 of FIG. 10).

The integrated circuit device 1100 may include one or more device layers 1104 disposed on the die substrate 1102. The device layer 1104 may include features of one or more transistors 1140 (e.g., metal oxide semiconductor field-effect transistors (MOSFETs)) formed on the die substrate 1102. The transistors 1140 may include, for example, one or more source and/or drain (S/D) regions 1120, a gate 1122 to control current flow between the S/D regions 1120, and one or more S/D contacts 1124 to route electrical signals to/from the S/D regions 1120. The transistors 1140 may include additional features not depicted for the sake of clarity, such as device isolation regions, gate contacts, and the like. The transistors 1140 are not limited to the type and configuration depicted in FIG. 11 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

A transistor 1140 may include a gate 1122 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1140 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1140 along the source-channel-drain direction, the gate electrode may consist of a U-shaped structure that includes a bottom portion substantially parallel to the surface of the die substrate 1102 and two sidewall portions that are substantially perpendicular to the top surface of the die substrate 1102. In other embodiments, at least one of the metal layers that form the gate electrode may simply be a planar layer that is substantially parallel to the top surface of the die substrate 1102 and does not include sidewall portions substantially perpendicular to the top surface of the die substrate 1102. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1120 may be formed within the die substrate 1102 adjacent to the gate 1122 of individual transistors 1140. The S/D regions 1120 may be formed using an implantation/diffusion process or an etching/deposition process, for example. In the former process, dopants such as boron, aluminum, antimony, phosphorous, or arsenic may be ion-implanted into the die substrate 1102 to form the S/D regions 1120. An annealing process that activates the dopants and causes them to diffuse farther into the die substrate 1102 may follow the ion-implantation process. In the latter process, the die substrate 1102 may first be etched to form recesses at the locations of the S/D regions 1120. An epitaxial deposition process may then be carried out to fill the recesses with material that is used to fabricate the S/D regions 1120. In some implementations, the S/D regions 1120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1120 may be formed using one or more alternate semiconductor materials such as germanium or a group III-V material or alloy. In further embodiments, one or more layers of metal and/or metal alloys may be used to form the S/D regions 1120.

Electrical signals, such as power and/or input/output (I/O) signals, may be routed to and/or from the devices (e.g., transistors 1140) of the device layer 1104 through one or more interconnect layers disposed on the device layer 1104 (illustrated in FIG. 11 as interconnect layers 1106-1110). For example, electrically conductive features of the device layer 1104 (e.g., the gate 1122 and the S/D contacts 1124) may be electrically coupled with the interconnect structures 1128 of the interconnect layers 1106-1110. The one or more interconnect layers 1106-1110 may form a metallization stack (also referred to as an "ILD stack") 1119 of the integrated circuit device 1100.

The interconnect structures 1128 may be arranged within the interconnect layers 1106-1110 to route electrical signals according to a wide variety of designs; in particular, the arrangement is not limited to the particular configuration of interconnect structures 1128 depicted in FIG. 11. Although a particular number of interconnect layers 1106-1110 is depicted in FIG. 11, embodiments of the present disclosure include integrated circuit devices having more or fewer interconnect layers than depicted.

In some embodiments, the interconnect structures 1128 may include lines **1128*a* and/or vias 1128*b* filled with an electrically conductive material such as a metal. The lines 1128*a* may be arranged to route electrical signals in a direction of a plane that is substantially parallel with a surface of the die substrate 1102 upon which the device layer 1104 is formed. For example, the lines 1128*a* may route electrical signals in a direction in and out of the page and/or in a direction across the page from the perspective of FIG. 13. The vias 1128*b* may be arranged to route electrical signals in a direction of a plane that is substantially perpendicular to the surface of the die substrate 1102 upon which the device layer 1104 is formed. In some embodiments, the vias 1128*b* may electrically couple lines 1128*a* of different interconnect layers 1106-1110** together.

The interconnect layers 1106-1110 may include a dielectric material 1126 disposed between the interconnect structures 1128, as shown in FIG. 11. In some embodiments, dielectric material 1126 disposed between the interconnect structures 1128 in different ones of the interconnect layers 1106-1110 may have different compositions; in other embodiments, the composition of the dielectric material 1126 between different interconnect layers 1106-1110 may be the same. The device layer 1104 may include a dielectric material 1126 disposed between the transistors 1140 and a bottom layer of the metallization stack as well. The dielectric material 1126 included in the device layer 1104 may have a different composition than the dielectric material 1126 included in the interconnect layers 1106-1110; in other embodiments, the composition of the dielectric material 1126 in the device layer 1104 may be the same as a dielectric material 1126 included in any one of the interconnect layers 1106-1110.

A first interconnect layer 1106 (referred to as Metal 1 or "M1") may be formed directly on the device layer 1104. In some embodiments, the first interconnect layer 1106 may include lines **1128*a* and/or vias 1128*b*, as shown. The lines 1128*a* of the first interconnect layer 1106 may be coupled with contacts (e.g., the S/D contacts 1124) of the device layer 1104. The vias 1128*b* of the first interconnect layer 1106 may be coupled with the lines 1128*a* of a second interconnect layer 1108**.

The second interconnect layer 1108 (referred to as Metal 2 or "M2") may be formed directly on the first interconnect layer 1106. In some embodiments, the second interconnect layer 1108 may include via **1128*b* to couple the lines 1128 of the second interconnect layer 1108 with the lines 1128*a* of a third interconnect layer 1110. Although the lines 1128*a* and the vias 1128*b* are structurally delineated with a line within individual interconnect layers for the sake of clarity, the lines 1128*a* and the vias 1128*b*** may be structurally and/or materially contiguous (e.g., simultaneously filled during a dual-damascene process) in some embodiments.

The third interconnect layer 1110 (referred to as Metal 3 or "M3") (and additional interconnect layers, as desired) may be formed in succession on the second interconnect layer 1108 according to similar techniques and configurations described in connection with the second interconnect layer 1108 or the first interconnect layer 1106. In some embodiments, the interconnect layers that are "higher up" in the metallization stack 1119 in the integrated circuit device 1100 (i.e., farther away from the device layer 1104) may be thicker that the interconnect layers that are lower in the metallization stack 1119, with lines **1128*a* and vias 1128*b*** in the higher interconnect layers being thicker than those in the lower interconnect layers.

The integrated circuit device 1100 may include a solder resist material 1134 (e.g., polyimide or similar material) and one or more conductive contacts 1136 formed on the interconnect layers 1106-1110. In FIG. 11, the conductive contacts 1136 are illustrated as taking the form of bond pads. The conductive contacts 1136 may be electrically coupled with the interconnect structures 1128 and configured to route the electrical signals of the transistor(s) 1140 to external devices. For example, solder bonds may be formed on the one or more conductive contacts 1136 to mechanically and/or electrically couple an integrated circuit die including the integrated circuit device 1100 with another component (e.g., a printed circuit board). The integrated circuit device 1100 may include additional or alternate structures to route the electrical signals from the interconnect layers 1106-1110; for example, the conductive contacts 1136 may include other analogous features (e.g., posts) that route the electrical signals to external components.

In some embodiments in which the integrated circuit device 1100 is a double-sided die, the integrated circuit device 1100 may include another metallization stack (not shown) on the opposite side of the device layer(s) 1104. This metallization stack may include multiple interconnect layers as discussed above with reference to the interconnect layers 1106-1110, to provide conductive pathways (e.g., including conductive lines and vias) between the device layer(s) 1104 and additional conductive contacts (not shown) on the opposite side of the integrated circuit device 1100 from the conductive contacts 1136.

In other embodiments in which the integrated circuit device 1100 is a double-sided die, the integrated circuit device 1100 may include one or more through silicon vias (TSVs) through the die substrate 1102; these TSVs may make contact with the device layer(s) 1104, and may provide conductive pathways between the device layer(s) 1104 and additional conductive contacts (not shown) on the opposite side of the integrated circuit device 1100 from the conductive contacts 1136. In some embodiments, TSVs extending through the substrate can be used for routing power and ground signals from conductive contacts on the opposite side of the integrated circuit device 1100 from the conductive contacts 1136 to the transistors 1140 and any other components integrated into the die 1100, and the metallization stack 1119 can be used to route I/O signals from the conductive contacts 1136 to transistors 1140 and any other components integrated into the die 1100.

Multiple integrated circuit devices 1100 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

FIG. 12 is a cross-sectional side view of an integrated circuit device assembly 1200 that may include any of the embedded passive structures disclosed herein. The integrated circuit device assembly 1200 includes a number of components disposed on a circuit board 1202 (which may be a motherboard, system board, mainboard, etc.). The integrated circuit device assembly 1200 includes components disposed on a first face 1240 of the circuit board 1202 and an opposing second face 1242 of the circuit board 1202; generally, components may be disposed on one or both faces 1240 and 1242.

In some embodiments, the circuit board 1202 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1202. In other embodiments, the circuit board 1202 may be a non-PCB substrate. The integrated circuit device assembly 1200 illustrated in FIG. 12 includes a package-on-interposer structure 1236 coupled to the first face 1240 of the circuit board 1202 by coupling components 1216. The coupling components 1216 may electrically and mechanically couple the package-on-interposer structure 1236 to the circuit board 1202, and may include solder balls (as shown in FIG. 12), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 1236 may include an integrated circuit component 1220 coupled to an interposer 1204 by coupling components 1218. The coupling components 1218 may take any suitable form for the application, such as the forms discussed above with reference to the coupling components 1216. Although a single integrated circuit component 1220 is shown in FIG. 12, multiple integrated circuit components may be coupled to the interposer 1204; indeed, additional interposers may be coupled to the interposer 1204. The interposer 1204 may provide an intervening substrate used to bridge the circuit board 1202 and the integrated circuit component 1220.

The integrated circuit component 1220 may be a packaged or unpacked integrated circuit product that includes one or more integrated circuit dies (e.g., the die 1002 of FIG. 10, the integrated circuit device 1100 of FIG. 11) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1220, a single monolithic integrated circuit die comprises solder bumps attached to contacts on the die. The solder bumps allow the die to be directly attached to the interposer 1204. The integrated circuit component 1220 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 1220 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 1220 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1220 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as “chiplets”. In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1204 may spread connections to a wider pitch or reroute a connection to a different connection. For example, the interposer 1204 may couple the integrated circuit component 1220 to a set of ball grid array (BGA) conductive contacts of the coupling components 1216 for coupling to the circuit board 1202. In the embodiment illustrated in FIG. 12, the integrated circuit component 1220 and the circuit board 1202 are attached to opposing sides of the interposer 1204; in other embodiments, the integrated circuit component 1220 and the circuit board 1202 may be attached to a same side of the interposer 1204. In some embodiments, three or more components may be interconnected by way of the interposer 1204.

In some embodiments, the interposer 1204 may be formed as a PCB, including multiple metal layers separated from one another by layers of dielectric material and interconnected by electrically conductive vias. In some embodiments, the interposer 1204 may be formed of an epoxy resin, a fiberglass-reinforced epoxy resin, an epoxy resin with inorganic fillers, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through hole vias 1210-1 (that extend from a first face 1250 of the interposer 1204 to a second face 1254 of the interposer 1204), blind vias 1210-2 (that extend from the first or second faces 1250 or 1254 of the interposer 1204 to an internal metal layer), and buried vias 1210-3 (that connect internal metal layers).

In some embodiments, the interposer 1204 can comprise a silicon interposer. Through silicon vias (TSV) extending through the silicon interposer can connect connections on a first face of a silicon interposer to an opposing second face of the silicon interposer. In some embodiments, an interposer 1204 comprising a silicon interposer can further comprise one or more routing layers to route connections on a first face of the interposer 1204 to an opposing second face of the interposer 1204.

The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art. In embodiments where the interposer is a non-printed circuit board The integrated circuit device assembly 1200 may include an integrated circuit component 1224 coupled to the first face 1240 of the circuit board 1202 by coupling components 1222. The coupling components 1222 may take the form of any of the embodiments discussed above with reference to the coupling components 1216, and the integrated circuit component 1224 may take the form of any of the embodiments discussed above with reference to the integrated circuit component 1220.

The integrated circuit device assembly 1200 illustrated in FIG. 12 includes a package-on-package structure 1234 coupled to the second face 1242 of the circuit board 1202 by coupling components 1228. The package-on-package structure 1234 may include an integrated circuit component 1226 and an integrated circuit component 1232 coupled together by coupling components 1230 such that the integrated circuit component 1226 is disposed between the circuit board 1202 and the integrated circuit component 1232. The coupling components 1228 and 1230 may take the form of any of the embodiments of the coupling components 1216 discussed above, and the integrated circuit components 1226 and 1232 may take the form of any of the embodiments of the integrated circuit component 1220 discussed above. The package-on-package structure 1234 may be configured in accordance with any of the package-on-package structures known in the art.

Figure 13:
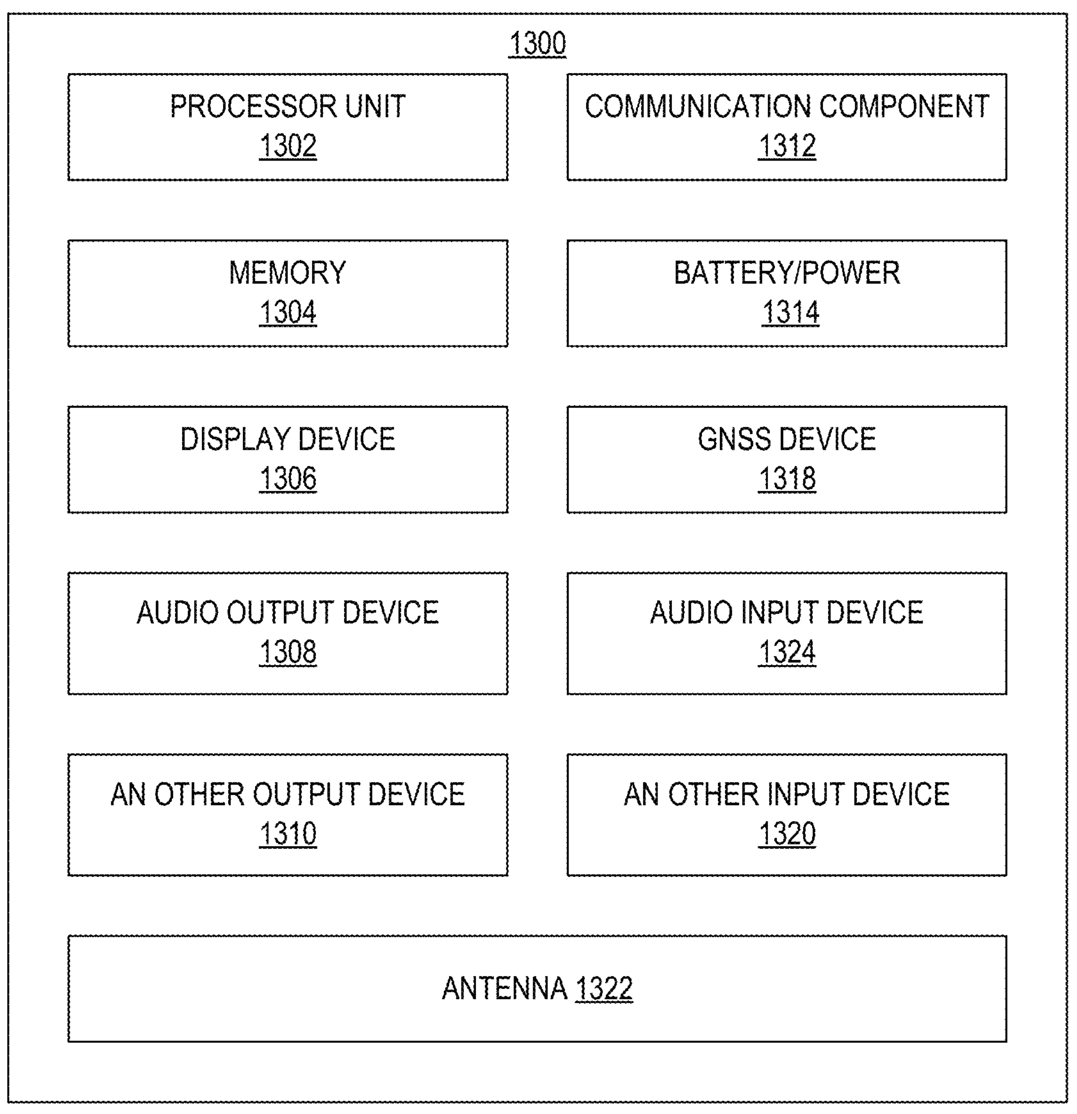
FIG. 13 is a block diagram of an example system or electrical device that may include a microelectronic assembly, in accordance with any of the embodiments disclosed herein.

FIG. 13 is a block diagram of an example electrical device 1300 that may include one or more of the conformal power delivery structures disclosed herein. For example, any suitable ones of the components of the electrical device 1300 may include one or more of the integrated circuit device assemblies 1200, integrated circuit components 1220, integrated circuit devices 1100, or integrated circuit dies 1002 disclosed herein. A number of components are illustrated in FIG. 13 as included in the electrical device 1300, but any one or more of these components may be omitted or duplicated, as suitable for the application. In some embodiments, some or all of the components included in the electrical device 1300 may be attached to one or more motherboards mainboards, or system boards. In some embodiments, one or more of these components are fabricated onto a single system-on-a-chip (SoC) die.

Additionally, in various embodiments, the electrical device 1300 may not include one or more of the components illustrated in FIG. 13, but the electrical device 1300 may include interface circuitry for coupling to the one or more components. For example, the electrical device 1300 may not include a display device 1306, but may include display device interface circuitry (e.g., a connector and driver circuitry) to which a display device 1306 may be coupled. In another set of examples, the electrical device 1300 may not include an audio input device 1324 or an audio output device 1308, but may include audio input or output device interface circuitry (e.g., connectors and supporting circuitry) to which an audio input device 1324 or audio output device 1308 may be coupled.

The electrical device 1300 may include one or more processor units 1302 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1302 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1300 may include a memory 1304, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 1304 may include memory that is located on the same integrated circuit die as the processor unit 1302. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1300 can comprise one or more processor units 1302 that are heterogeneous or asymmetric to another processor unit 1302 in the electrical device 1300. There can be a variety of differences between the processing units 1302 in a system in terms of a spectrum of metrics of merit including architectural, microarchitectural, thermal, power consumption characteristics, and the like. These differences can effectively manifest themselves as asymmetry and heterogeneity among the processor units 1302 in the electrical device 1300.

In some embodiments, the electrical device 1300 may include a communication component 1312 (e.g., one or more communication components). For example, the communication component 1312 can manage wireless communications for the transfer of data to and from the electrical device 1300. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1312 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1312 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1312 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1312 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1312 may operate in accordance with other wireless protocols in other embodiments. The electrical device 1300 may include an antenna 1322 to facilitate wireless communications and/or to receive other wireless communications (such as AM or FM radio transmissions).

In some embodiments, the communication component 1312 may manage wired communications, such as electrical, optical, or any other suitable communication protocols (e.g., IEEE 802.3 Ethernet standards). As noted above, the communication component 1312 may include multiple communication components. For instance, a first communication component 1312 may be dedicated to shorter-range wireless communications such as Wi-Fi or Bluetooth, and a second communication component 1312 may be dedicated to longer-range wireless communications such as global positioning system (GPS), EDGE, GPRS, CDMA, WiMAX, LTE, EV-DO, or others. In some embodiments, a first communication component 1312 may be dedicated to wireless communications, and a second communication component 1312 may be dedicated to wired communications.

The electrical device 1300 may include battery/power circuitry 1314. The battery/power circuitry 1314 may include one or more energy storage devices (e.g., batteries or capacitors) and/or circuitry for coupling components of the electrical device 1300 to an energy source separate from the electrical device 1300 (e.g., AC line power).

The electrical device 1300 may include a display device 1306 (or corresponding interface circuitry, as discussed above). The display device 1306 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1300 may include an audio output device 1308 (or corresponding interface circuitry, as discussed above). The audio output device 1308 may include any embedded or wired or wirelessly connected external device that generates an audible indicator, such speakers, headsets, or earbuds.

The electrical device 1300 may include an audio input device 1324 (or corresponding interface circuitry, as discussed above). The audio input device 1324 may include any embedded or wired or wirelessly connected device that generates a signal representative of a sound, such as microphones, microphone arrays, or digital instruments (e.g., instruments having a musical instrument digital interface (MIDI) output). The electrical device 1300 may include a Global Navigation Satellite System (GNSS) device 1318 (or corresponding interface circuitry, as discussed above), such as a Global Positioning System (GPS) device. The GNSS device 1318 may be in communication with a satellite-based system and may determine a geolocation of the electrical device 1300 based on information received from one or more GNSS satellites, as known in the art.

The electrical device 1300 may include another output device 1310 (or corresponding interface circuitry, as discussed above). Examples of the other output device 1310 may include an audio codec, a video codec, a printer, a wired or wireless transmitter for providing information to other devices, or an additional storage device.

The electrical device 1300 may include another input device 1320 (or corresponding interface circuitry, as discussed above). Examples of the other input device 1320 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1300 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra-mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1300 may be any other electronic device that processes data. In some embodiments, the electrical device 1300 may comprise multiple discrete physical components. Given the range of devices that the electrical device 1300 can be manifested as in various embodiments, in some embodiments, the electrical device 1300 can be referred to as a computing device or a computing system.

Figure 14:
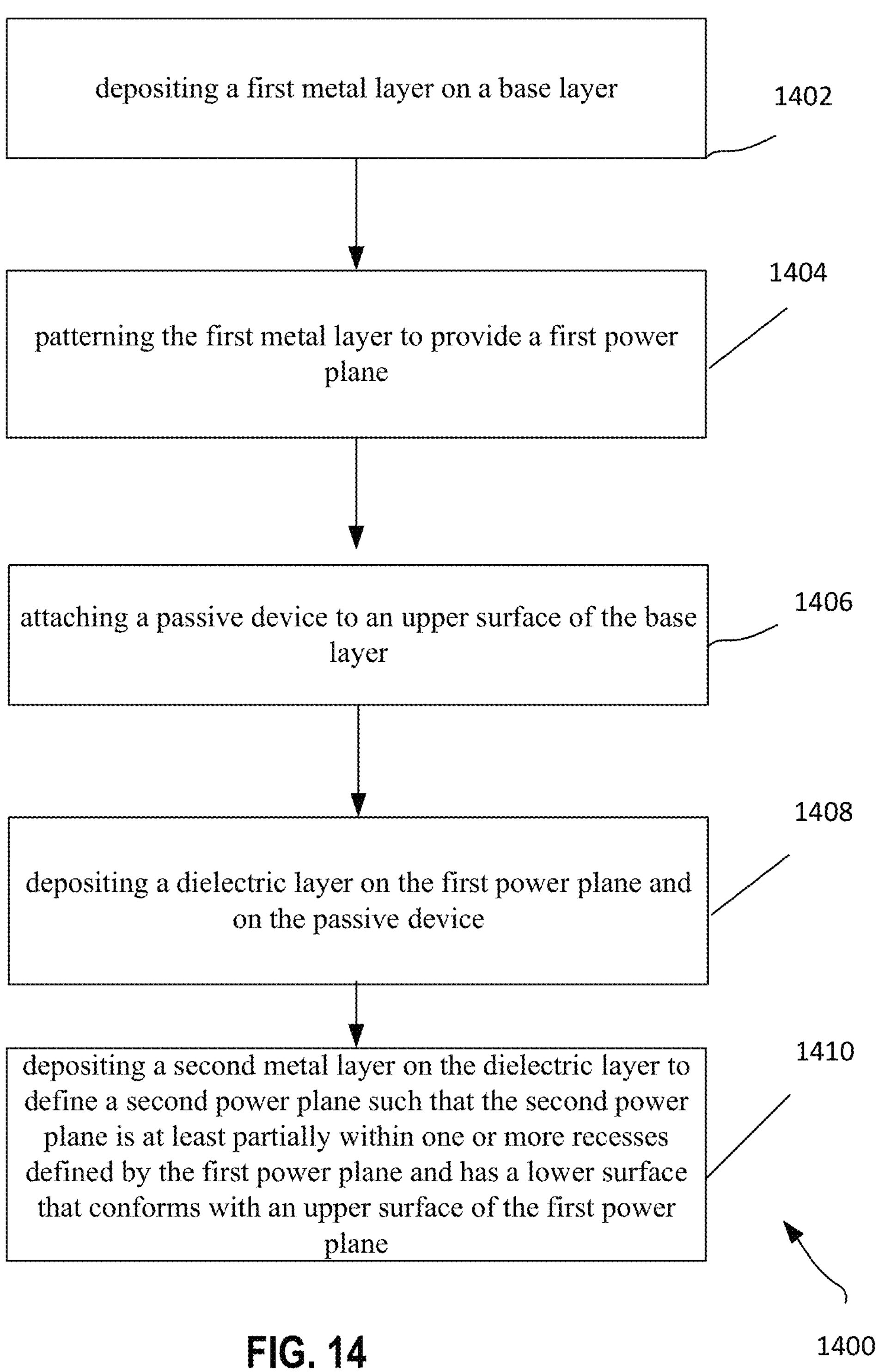
FIG. 14 illustrates an example process according to some embodiments.

FIG. 14 shows a process 1400 to manufacture an embedded passive structure according to some embodiments. At operation 1402, the process includes depositing a first metal layer on a base layer; at operation 1404, the process includes patterning the first metal layer to provide a first power plane; at operation 1406, the process includes attaching a passive device to an upper surface of the base layer; at operation 1408, the process includes depositing a dielectric layer on the first power plane and on the passive device; and at operation 1410, the process includes depositing a second metal layer on the dielectric layer to define a second power plane such that the second power plane is at least partially within one or more recesses defined by the first power plane and has a lower surface that conforms with an upper surface of the first power plane Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of embodiments has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

In embodiments, the phrase "A is located on B" means that at least a part of A is in direct physical contact or indirect physical contact (having one or more other features between A and B) with at least a part of B.

In the instant description, "A is adjacent to B" means that at least part of A is in direct physical contact with at least a part of B.

In the instant description, "B is between A and C" means that at least part of B is in or along a space separating A and C and that the at least part of B is in direct or indirect physical contact with A and C.

In the instant description, "A is attached to B" means that at least part of A is mechanically attached to at least part of B, either directly or indirectly (having one or more other features between A and B).

Elements referred to herein with a common reference label followed by a particular number or alphabet may be collectively referred to by the reference label alone. For example, element 101*a*, 101*b*, 101-1, 101-2, may be collectively and generally referred to element 101 in plural, or element 101 in singular.

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," "according to some embodiments," "in accordance with embodiments," or "in embodiments," which may each refer to one or more of the same or different embodiments. Furthermore, the terms "comprising," "including," "having," and the like, as used with respect to embodiments of the present disclosure, are synonymous.

"Coupled" as used herein means that two or more elements are in direct physical contact, or that that two or more elements indirectly physically contact each other, but yet still cooperate or interact with each other (i.e. one or more other elements are coupled or connected between the elements that are said to be coupled with each other). The term “directly coupled” means that two or more elements are in direct contact.

As used herein, the term “module” refers to being part of, or including an ASIC, an electronic circuit, a system on a chip, a processor (shared, dedicated, or group), a solid state device, a memory (shared, dedicated, or group) that execute one or more software or firmware programs, a combinational logic circuit, and/or other suitable components that provide the described functionality.

As used herein, “electrically conductive” in some examples may refer to a property of a material having an electrical conductivity greater than or equal to $10^7$ Siemens per meter (S/m) at 20 degrees Celsius. Examples of such materials include Cu, Ag, Al, Au, W, Zn and Ni.

As used herein, an “integrated circuit structure” may include one or more microelectronic dies.

In the corresponding drawings of the embodiments, signals, currents, electrical biases, or magnetic or electrical polarities may be represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, polarity, current, voltage, etc, as dictated by design needs or preferences, may actually comprise one or more signals that may travel in either direction and may be implemented with any suitable type of signal scheme.

Throughout the specification, and in the claims, the term “connected” means a direct connection, such as electrical, mechanical, or magnetic connection between the elements that are connected, without any intermediary devices. The term “coupled” means a direct or indirect connection, such as a direct electrical, mechanical, or magnetic connection between the elements that are connected or an indirect connection, through one or more passive or active intermediary devices. The term “signal” may refer to at least one current signal, voltage signal, magnetic signal, or data/clock signal. The meaning of “a,” “an,” and “the” include plural references. The meaning of “in” includes “in” and “on.”

The terms “substantially,” “close,” “approximately,” “near,” and “about,” generally refer to being within +/−10% of a target value (unless specifically specified). Unless otherwise specified the use of the ordinal adjectives “first,” “second,” and “third,” etc., to describe a common object, merely indicate that different instances of like objects are being referred to, and are not intended to imply that the objects so described must be in a given sequence, either temporally, spatially, in ranking or in any other manner.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term “MN” indicates an n-type transistor (e.g., NMOS, NPN BJT, etc.) and the term “MP” indicates a p-type transistor (e.g., PMOS, PNP BJT, etc.).

EXAMPLES

Some examples of embodiments are provided below.

Example 1 an embedded passive structure comprising: a base layer; a passive device attached to the base layer; a first power plane comprising metal and adjacent an upper surface of the base layer, the first power plane having a portion electrically coupled to a terminal of the passive device, wherein an upper surface of a combination of the first power plane and the passive device defines a recess; a second power plane comprising metal, the second power plane at least partially within the recess and having a lower surface that conforms with the upper surface of the combination; and a liner including a dielectric layer between the first power plane and the second power plane.

Example 2 includes the subject matter of Example 1, wherein the portion is a first portion and the terminal is a first terminal, the first power plane further including a second portion electrically coupled to a second terminal of the passive device.

Example 3 includes the subject matter of Example 1, wherein the terminal is a first terminal, the second power plane electrically coupled to a second terminal of the passive device.

Example 4 includes the subject matter of Example 1, wherein the first and second power planes are co-planar with one another in areas defined by the recess.

Example 5 includes the subject matter of Example 1, wherein the second power plane has a granular microstructure including randomly distributed particles presenting substantially non-linear particle-to-particle boundaries with one another.

Example 6 includes the subject matter of Example 5, wherein the particles have sizes ranging from about 10 microns to about 100 microns.

Example 7 includes the subject matter of Example 5, wherein the granular microstructure has a maximum porosity of about 5%.

Example 8 includes the subject matter of Example 5, further including a buffer layer between the second power plane and at least one of the first power plane, the passive device or the base layer, wherein an interface between the buffer layer and second power plane has a non-flat configuration as compared with an interface between the first power plane and the base layer, wherein some particles of the second power plane are at least in part embedded within indentations of the buffer layer.

Example 9 includes the subject matter of Example 8, wherein the buffer layer includes at least one of indium, silver, gold, tin, lead, titanium, nickel, vanadium, or alloys thereof.

Example 10 includes the subject matter of Example 1, further including solder between the passive device and the base layer, the solder attaching the passive device to the base layer.

Example 11 includes the subject matter of Example 3, wherein the dielectric layer defines an opening therein in registration with the second terminal.

Example 12 includes the subject matter of Example 1, wherein the base layer includes one of a circuit board, a layer of a circuit board, a die or a wafer.

Example 13 includes a microelectronic system including: a package substrate; a die electrically and mechanically coupled to the package substrate; an embedded passive structure attached to the package substrate and including: a passive device; a first power plane comprising metal and having a portion electrically coupled to a terminal of the passive device, wherein an upper surface of a combination of the first power plane and the passive device defines a recess; a second power plane comprising metal, the second power plane at least partially within the recess and having a lower surface that conforms with the upper surface of the combination; and a liner including a dielectric layer between the first power plane and the second power plane.

Example 14 includes the subject matter of Example 13, wherein the embedded passive structure is attached inside the package substrate or on a surface of the package substrate.

Example 15 includes the subject matter of Example 14, further including a stacked die assembly electrically and mechanically coupled to a die side of the package substrate, the embedded passive structure being in the stacked die assembly.

Example 16 includes the subject matter of Example 13, further including: a set of embedded passive structures including the embedded passive structure, the set of embedded passive structures inside the package substrate; and a plurality of transistors selectively electrically coupled to corresponding terminals of the set of embedded passive structures, the set of embedded passive structures being between two sets of the plurality of transistors, individual ones of the sets of the plurality of transistors being within a corresponding active layers of the package substrate.

Example 17 includes the subject matter of Example 16, further including a top die electrically and mechanically coupled to one side of the package substrate, and a bottom die electrically and mechanically coupled to an opposing side of the package substrate.

Example 18 includes the subject matter of Example 13, wherein the second power plane electrically couples the package substrate to the die.

Example 19 includes an electrical system including: one or more processing units; a memory coupled to the one or more processing units; and a microelectronic system coupled to the one or more processing units, and including: a package substrate; a die electrically and mechanically coupled to the package substrate; an embedded passive structure attached to the package substrate and including: a passive device; a first power plane comprising metal and having a portion electrically coupled to a terminal of the passive device, wherein an upper surface of a combination of the first power plane and the passive device defines a recess; a second power plane comprising metal, the second power plane at least partially within the recess and having a lower surface that conforms with the upper surface of the combination; and a liner including a dielectric layer between the first power plane and the second power plane.

Example 20 includes the subject matter of Example 19, wherein the second power plane has a granular microstructure including randomly distributed particles presenting substantially non-linear particle-to-particle boundaries with one another.

Example 21 includes the subject matter of Example 20, wherein the particles have sizes ranging from about 10 microns to about 100 microns.

Example 22 includes a method of manufacturing an embedded passive structure, the method comprising: depositing a first metal layer on a base layer; patterning the first metal layer to provide a first power plane; attaching a passive device to an upper surface of the base layer; depositing a dielectric layer on the first power plane and on the passive device; and depositing a second metal layer on the dielectric layer to define a second power plane such that the second power plane is at least partially within one or more recesses defined by the first power plane and has a lower surface that conforms with an upper surface of the first power plane.

Example 23 includes the subject matter of Example 22, wherein the second metal layer is deposited via a cold spray process.

Example 24 includes the subject matter of Example 22, further including patterning the dielectric layer to define an opening therein in registration with a terminal of the passive device.

Example 25 includes the subject matter of Example 22, further including providing a buffer layer on the dielectric layer prior to depositing the second metal layer.

Example 26 includes a product made by the process of any one of the methods of Examples 22-25.

Example 27 includes means to perform the method of any one of Examples 22-25.

In the foregoing, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment(s) and other exemplarily language does not necessarily refer to the same embodiment or the same example, but may refer to different and distinct embodiments, as well as potentially the same embodiment.

The invention claimed is:

1. An embedded passive structure comprising:

a base layer;

a passive device attached to the base layer;

a first power plane comprising metal and adjacent an upper surface of the base layer, the first power plane having a portion electrically coupled to a terminal of the passive device, wherein an upper surface of a combination of the first power plane and the passive device defines a recess;

a second power plane on the first power plane and comprising metal, the second power plane at least partially within the recess and having a lower surface that conforms with the upper surface of the combination, wherein the second power plane has a granular microstructure including randomly distributed particles presenting substantially non-linear particle-to-particle boundaries with one another; and a liner including a dielectric layer, the liner on the first power plane, on the passive device, and between the first power plane and the second power plane, the liner further partially within the recess.

2. The embedded passive structure of claim 1, wherein the portion is a first portion and the terminal is a first terminal, the first power plane further including a second portion electrically coupled to a second terminal of the passive device.

3. The embedded passive structure of claim 1, wherein the terminal is a first terminal, the second power plane electrically coupled to a second terminal of the passive device.

4. The embedded passive structure of claim 3, wherein the dielectric layer defines an opening therein in registration with the second terminal.

5. The embedded passive structure of claim 1, wherein the first and second power planes are co-planar with one another in areas defined by the recess.

6. The embedded passive structure of claim 1, wherein the particles have sizes ranging from about 10 microns to about 100 microns.

7. The embedded passive structure of claim 1, wherein the granular microstructure has a maximum porosity of about 5%.

8. The embedded passive structure of claim 1, further including a buffer layer between the second power plane and at least one of the first power plane, the passive device or the base layer, wherein an interface between the buffer layer and second power plane has a non-flat configuration as compared with an interface between the first power plane and the base layer, wherein some particles of the second power plane are at least in part embedded within indentations of the buffer layer.

9. The embedded passive structure of claim 8, wherein the buffer layer includes at least one of indium, silver, gold, tin, lead, or alloys thereof.

10. The embedded passive structure of claim 1, further including solder between the passive device and the base layer, the solder attaching the passive device to the base layer.

11. The embedded passive structure of claim 1, wherein the base layer includes one of a circuit board, a layer of a circuit board, a die or a wafer.

12. A microelectronic system including:

a package substrate;

a die electrically and mechanically coupled to the package substrate;

an embedded passive structure attached to the package substrate and including:

a passive device;

a first power plane comprising metal and having a portion electrically coupled to a terminal of the passive device, wherein an upper surface of a combination of the first power plane and the passive device defines a recess;

a second power plane on the first power plane and comprising metal, the second power plane at least partially within the recess and having a lower surface that conforms with the upper surface of the combination, wherein the second power plane has a granular microstructure including randomly distributed particles presenting substantially non-linear particle-to-particle boundaries with one another; and a liner including a dielectric layer, the liner on the first power plane, on the passive device, and between the first power plane and the second power plane, the liner further partially within the recess.

13. The microelectronic system of claim 12, wherein the embedded passive structure is attached inside the package substrate or on a surface of the package substrate.

14. The microelectronic system of claim 13, further including a stacked die assembly electrically and mechanically coupled to a die side of the package substrate, the embedded passive structure being in the stacked die assembly.

15. The microelectronic system of claim 12, further including:

a set of embedded passive structures including the embedded passive structure, the set of embedded passive structures inside the package substrate; and a plurality of transistors selectively electrically coupled to corresponding terminals of the set of embedded passive structures, the set of embedded passive structures being between two sets of the plurality of transistors, individual ones of the sets of the plurality of transistors being within a corresponding active layers of the package substrate.

16. The microelectronic system of claim 15, further including a top die electrically and mechanically coupled to one side of the package substrate, and a bottom die electrically and mechanically coupled to an opposing side of the package substrate.

17. The microelectronic system of claim 12, wherein the second power plane electrically couples the package substrate to the die.

18. An electrical system including:

one or more processing units;

a memory coupled to the one or more processing units; and a microelectronic system coupled to the one or more processing units, and including:

a package substrate;

a die electrically and mechanically coupled to the package substrate;

an embedded passive structure attached to the package substrate and including:

a passive device;

a first power plane comprising metal and having a portion electrically coupled to a terminal of the passive device, wherein an upper surface of a combination of the first power plane and the passive device defines a recess;

a second power plane on the first power plane and comprising metal, the second power plane at least partially within the recess and having a lower surface that conforms with the upper surface of the combination, wherein the second power plane has a granular microstructure including randomly distributed particles presenting substantially non-linear particle-to-particle boundaries with one another; and a liner including a dielectric layer, the liner on the first power plane, on the passive device, and between the first power plane and the second power plane, the liner further partially within the recess.

19. The system of claim 18, wherein the particles have sizes ranging from about 10 microns to about 100 microns.

* * * * *